(12) United States Patent
Sugihara et al.

(10) Patent No.: US 8,093,589 B2
(45) Date of Patent: Jan. 10, 2012

(54) SEMICONDUCTOR DEVICE WITH AN ACTIVE LAYER CONTAINING ZINC OXIDE, MANUFACTURING METHOD, AND ELECTRONIC DEVICE

(75) Inventors: Toshinori Sugihara, Kameyama (JP); Hideo Ohno, Sendai (JP); Masashi Kawasaki, Sendai (JP)

(73) Assignees: Sharp Kabushiki Kaisha, Osaka (JP); Hideo Ohno, Miyagi (JP); Masashi Kawasaki, Miyagi (JP)

( * ) Notice: Subject to any disclaimer, the term of this patent is extended or adjusted under 35 U.S.C. 154(b) by 89 days.

(21) Appl. No.: 10/560,907

(22) PCT Filed: Jun. 14, 2004

(86) PCT No.: PCT/JP2004/008322
§ 371 (c)(1),
(2), (4) Date: Dec. 16, 2005

(87) PCT Pub. No.: WO2004/114391
PCT Pub. Date: Dec. 29, 2004

(65) Prior Publication Data
US 2006/0244107 A1 Nov. 2, 2006

(30) Foreign Application Priority Data
Jun. 20, 2003 (JP) .................................. 2003-177272
Mar. 18, 2004 (JP) .................................. 2004-079273

(51) Int. Cl.
*H01L 29/10* (2006.01)
(52) U.S. Cl. .............. 257/43; 257/76; 257/78; 257/613; 257/614; 257/E21.411; 257/E29.094; 257/E29.202; 257/E29.273; 257/E29.296

(58) Field of Classification Search ............ 257/43, 257/613, E21.372, E29.273, E27.06, E29.169, 257/E29.242, E21.051, E21.4, 76, 78, 614, 257/E21.411, E29.094, E29.202, E29.296
See application file for complete search history.

(56) References Cited

U.S. PATENT DOCUMENTS
4,204,217 A * 5/1980 Goodman .................. 257/410
(Continued)

FOREIGN PATENT DOCUMENTS
JP 63-101740 A 5/1988
(Continued)

OTHER PUBLICATIONS
International Search Report for PCT/JP2004/008322 dated Sep. 21, 2004 (English and Japanese).
Joseph et al; *p-Type Electrical Conduction in ZnO Thin Films by Ga and N Codoping*, Jpn. J. Appl. Phys. vol. 38 (1999), Part 2, No. 11A, Nov. 1, 1999, pp. 1205-1207.
(Continued)

*Primary Examiner* — Jay C Kim
(74) *Attorney, Agent, or Firm* — Nixon & Vanderhye P.C.

(57) ABSTRACT

In a thin film transistor (1), a gate insulating layer (4) is formed on a gate electrode (3) formed on an insulating substrate (2). Formed on the gate insulating layer (4) is a semiconductor layer (5). Formed on the semiconductor layer (5) are a source electrode (6) and a drain electrode (7). A protective layer (8) covers them, so that the semiconductor layer (5) is blocked from an atmosphere. The semiconductor layer (5) (active layer) is made of, e.g., a semiconductor containing polycrystalline ZnO to which, e.g., a group V element is added. This allows practical use of a semiconductor device which has an active layer made of zinc oxide and which includes an protective layer for blocking the active layer from an atmosphere.

31 Claims, 18 Drawing Sheets

U.S. PATENT DOCUMENTS

| | | | |
|---|---|---|---|
| 4,751,149 A * | 6/1988 | Vijayakumar et al. | 428/702 |
| 5,166,816 A * | 11/1992 | Kaneko et al. | 257/59 |
| 5,674,599 A * | 10/1997 | Yamada | 428/212 |
| 6,727,522 B1 | 4/2004 | Kawasaki et al. | |
| 6,878,962 B1 | 4/2005 | Kawasaki et al. | |
| 2002/0056838 A1 * | 5/2002 | Ogawa | 257/59 |
| 2003/0047785 A1 * | 3/2003 | Kawasaki et al. | 257/350 |
| 2003/0218222 A1 * | 11/2003 | Wager et al. | 257/410 |
| 2004/0061114 A1 * | 4/2004 | Yan et al. | 257/76 |

FOREIGN PATENT DOCUMENTS

| | | |
|---|---|---|
| JP | 8-264794 | 10/1996 |
| JP | 2000-150900 A | 5/2000 |
| JP | 2000-277534 A | 10/2000 |
| JP | 2002-76356 A | 3/2002 |
| JP | 2002-289859 | 10/2002 |
| JP | 2003-86808 | 3/2003 |
| KR | 2003-0022692 A | 3/2003 |

OTHER PUBLICATIONS

Minegishi et al., *Growth of p-type Zinc Oxide Films by Chemical Vapor Deposition*, Jpn. J. Appl. Phys., vol. 36 (1997), Part 2, No. 11A, Nov. 1, 1997, pp. 1453-1455.

Hoffman et al, "ZnO-based transparent thin-film transistors", Applied Physics Letters, vol. 82, No. 5, Feb. 3, 2003, pp. 733-735.

Carcia et al, "Transparent ZnO thin-film transistor fabricated by rf magnetron sputtering", Applied Physics Letters, vol. 82, No. 7, Feb. 17, 2003, pp. 1117-1119.

Nishii et al, "High Mobility Thin Film Transistors with Transparent ZnO Channels", Jpn. J. Appl. Phys., vol. 42, 2003, Part 2, No. 4A Apr. 1, 2003 © 2003 The Japan Society of Applied Physics, pp. L347-L349.

* cited by examiner

SEMICONDUCTOR DEVICE WITH AN ACTIVE LAYER CONTAINING ZINC OXIDE, MANUFACTURING METHOD, AND ELECTRONIC DEVICE

This application is the US national phase of international application PCT/JP2004/008322 filed 14 Jun. 2004, which designated the U.S. and claims priority to JP 177272/2003 filed 20 Jun. 2003, and JP 79273/2004 filed 18 Mar. 2004, the entire contents of each of which are hereby incorporated by reference.

TECHNICAL FIELD

The present invention relates to a semiconductor device having an active layer made of a zinc oxide. The present invention particularly relates to (i) a semiconductor device suitable for a switching element for use in an electronic device, and (ii) an electronic device using the semiconductor device.

BACKGROUND ART

Conventionally, zinc oxide (ZnO) is transparent in a visible light region, and is a semiconductor having a relatively good property even when prepared under a low temperature. For this reason, study on ZnO has been actively carried out in recent years, so that various techniques have been reported.

For example, see Documents 1 through 3 of scientific papers. Each of the scientific papers teaches that a thin film transistor having an active layer made of ZnO operates with high performance.

(1) Document 1:
R. L. Hoffman, B. J. Norris and J. F. Wager, "ZnO-based transparent thin-film transistors" APPLIED PHYSICS LETTERS VOLUME 82, NUMBER 5, 3 FEBRUARY 2003, pp 733-735
(2) Document 2:
P. F. Carcia, R. S. McLean, M. H. Reilly and G. Nunes, Jr. "Transparent ZnO thin-film transistor fabricated by rf magnetron suputtering" APPLIED PHYSICS LETTERS VOLUME 82, NUMBER 7, 17 FEBRUARY 2003, pp 1117-1119
(3) Document 3:
Junya NISHII et al., "High Performance Thin Film Transistors with Transparent ZnO Channels" Jpn. J. Appl. Phys. Vol. 42. (2003) pp L347-L349, Part 2, No. 4A, 1 April
Further, see Documents 4 through 6 of patent applications. Each of Documents 4 through 6 discloses a technique of using ZnO as a semiconductor.
(4) Document 4:
Japanese Unexamined Patent Publication Tokukai 2000-150900 (published on May 30, 2000)
(5) Document 5:
Japanese Unexamined Patent Publication Tokukai 2000-277534 (published on Oct. 6, 2000)
(6) Document 6
Japanese Unexamined Patent Publication Tokukai 2002-76356 (published on Mar. 15, 2002)
(7) Document 7
Japanese Unexamined Patent Publication Tokukaisho 63-101740 (published on May 6, 1988)

Described in Document 4 is that a transistor becomes transparent by using a transparent semiconductor such as zinc oxide for a channel layer of the transistor, and by using a transparent insulating oxide for a gate insulating layer.

Described in Document 5 is that: lattice mismatch between zinc oxide and a priming film is eliminated by selecting a material of the priming film, with the result that a semiconductor device including a thin film transistor using zinc oxide can have high performance.

Described in Document 6 is a method for doping a 3d transition metal in zinc oxide for the purpose of improving an ON/OFF ratio property and a mobility property of a transistor having a transparent channel layer made of zinc oxide or the like.

Each of the scientific papers and the documents teaches effectiveness of the transistor using zinc oxide.

However, zinc oxide is highly sensitive to an atmosphere, so that a property of the device using zinc oxide is greatly changed due to the atmosphere, as disclosed in Document 7. Therefore, a layer of zinc oxide needs to be blocked from the atmosphere by a protective layer (insulator) such that the device is put into practical use. Document 4 describes that a vertical type electric field effect transistor having the channel layer made of zinc oxide is used as a gas sensor.

No protective layer is provided in each structure of Documents 1, 2, and 3. Moreover, none of Documents 1, 2, and 3 describe an influence rendered by providing the protective layer. Meanwhile, each of Documents 4, 5, and 6 describes an example of a structure of blocking the zinc oxide layer from the atmosphere; however, none of Documents 4, 5, and 6 describe the influence rendered by providing the protective layer. Here, the aforementioned gate insulating layer corresponds to the protective layer.

For the practical use, the transistor having the active layer made of zinc oxide is required to have a stable property. An indispensable condition for attaining such a stable property is to block, from the atmosphere, the layer of zinc oxide highly sensitive to the atmosphere. For this reason, the influence rendered by providing the protective layer needs to be discussed. The following explains this.

FIG. 14(a) illustrates a transistor 50 having no protective layer. The transistor 50 has an inverse stagger structure. Specifically, a gate electrode 53 made of Ta is formed on a glass substrate 52. On the glass substrate 52 and the gate electrode 53, a gate insulating layer 54 made of $Al_2O_3$ is formed. Formed on the gate insulating layer 54 is a semiconductor layer 55 made of zinc oxide which has not been subjected to doping intentionally. Formed on the semiconductor layer 55 and the gate insulating layer 54 are a source electrode 56 and a drain electrode 57, each of which is made of Al.

FIG. 14(b) illustrates a transistor 51 provided with a protective layer. The transistor 51 has a structure similar to the transistor 50, except that a protective layer 58 made of $Al_2O_3$ is so provided as to cover a part of the semiconductor layer 55, a part of the source electrode 56, and a part of the drain electrode 57.

FIG. 15 illustrates the difference between (i) the $I_d$-$V_g$ property of the electric field effect transistor which has the active layer (semiconductor layer 55) made of zinc oxide and which has the protective layer, and (ii) the $I_d$-$V_g$ property of the electric field effect transistor which has the active layer (semiconductor layer 55) made of zinc oxide and which has no protective layer.

As shown in FIG. 15, the transistor having the protective layer has a threshold voltage greatly different from that of the transistor having no protective layer. Specifically, the threshold voltage of the transistor having the protective layer is greatly shifted to the negative side, as compared with that of the transistor having no protective layer. Such a greatly negative threshold voltage makes it impossible that the transistor is put into practical use.

The following explains why such a phenomenon occurs. That is, zinc oxide is intrinsically likely to have an oxygen hole from which free electrons are generated, so that zinc oxide is a semiconductor having the n-type conductivity. However, when the surface level of the zinc oxide layer decreases the fermi level of the surface of the zinc oxide layer, a depletion layer spreads inside the zinc oxide layer to reach the interface of the gate insulating layer serving as a channel layer, with the result that the free electrons are removed. This causes the zinc oxide layer to have a high resistance. Therefore, such a zinc oxide layer having high resistance has a small number of free electrons that are movable charges, with the result that a small gate voltage is required for removal of the free electrons. Accordingly, the absolute value of the threshold voltage becomes small. This is true when no protective layer is provided.

In the meanwhile, the surface level of the zinc oxide layer is decreased by covering the zinc oxide layer with the protective layer made of $Al_2O_3$. This can be understood based on the report of 29p-F-8 (2003 March) of Japan Society of Applied Physics 50$^{th}$ meeting. Specifically, it is reported that: zinc oxide and $Al_2O_3$ match well with each other, so that a defect level is small. Such reduction of the surface level causes the fermi level of the surface of the zinc oxide layer to be restored to a position determined by the density of the free electrons intrinsically included in zinc oxide. Accordingly, no depletion layer spreads inside the zinc oxide layer. With this, the zinc oxide layer is caused to have the intrinsic n-type conductivity, with the result that the zinc oxide layer has a low resistance. Therefore, a large number of free electrons exist in such a zinc oxide layer. Required for removal of such a large number of free electrons is a great negative gate voltage. Accordingly, the threshold voltage is greatly negative.

FIG. 16 illustrates the difference between (i) the resistivity of the zinc oxide layer in cases where the protective layer made of $Al_2O_3$ is provided, and (ii) the resistivity of the zinc oxide layer in cases where no protective layer is provided. As shown in FIG. 16, the resistivity of the zinc oxide layer is reduced to approximately $\frac{1}{6400}$ by providing the protective layer. This is an evidence of the aforementioned workings.

This is the first time to find and discuss that the property of the electric field effect transistor using zinc oxide for the active layer is greatly changed by providing the protective layer as described above.

Zinc oxide is sensitive to the atmosphere, so that the protective layer is imperative for the electric field effect transistor using zinc oxide for the active layer. However, as described above, the electric field effect transistor having the protective layer has the greatly negative threshold voltage. For this reason, such an electric field effect transistor cannot be put into practical use.

The present invention is made in light of the problem, and its object is to provide (i) a semiconductor device which use zinc oxide for an active layer, and which has a protective layer for blocking the active layer from an atmosphere, and which can be put into practical use; and (ii) an electronic device including the semiconductor device.

DISCLOSURE OF INVENTION

A semiconductor device of the present invention include: (1) an active layer, to which group I elements, group III elements, group IV elements, group V elements, or group VII elements are added, and which is made of a semiconductor containing (i) polycrystalline ZnO or polycrystalline $Mg_xZn_{1-x}O$, (ii) amorphous ZnO or amorphous $Mg_xZn_{1-x}O$, or (iii) either (a) mixture of the polycrystalline ZnO and the amorphous ZnO or (b) mixture of the polycrystalline $Mg_xZn_{1-x}O$ and the amorphous $Mg_xZn_{1-x}O$; and (2) a blocking member for blocking the active layer from an atmosphere such that the atmosphere never influences a region, in which a movable charge moves, of the active layer.

In the structure above, the blocking member may include not only a protective layer and an insulating layer but also an electrode and the like, as long as the active layer is blocked from the atmosphere. Further, the active layer may be wholly blocked by the blocking member. However, a part of the active layer may not be blocked by the blocking member, i.e., may be exposed to the atmosphere, as long as the active layer is blocked such that at least the region, in which the movable electric charges move, of the active layer is not influenced by the atmosphere. A specific example of such a region is the channel portion of a thin film transistor.

An element property of the semiconductor device can be stabilized by blocking, from the atmosphere in this way, the active layer made of the ZnO or the $Mg_xZn_{1-x}O$ each sensitive to the atmosphere. Further, the addition of the group I elements, the group III elements, the group IV elements, the group V elements, or the group VII elements to the active layer makes it possible to reduce the movable charges which are generated as the result of providing the blocking member such as the protective layer. This is explained as follows. That is, the formation of the protective layer or the like causes decrease of the surface level of the layer of, e.g., the ZnO, with the result that a depletion layer spread within the ZnO layer is eliminated. With this, the ZnO layer becomes an n-type semiconductor, with the result that too many free electrons are generated. However, for example, nitrogen of the group V elements works as an acceptor impurity with respect to the ZnO layer, so that the free electrons are reduced by adding nitrogen. Further, hydrogen of the group I elements works as a terminator with respect to the dangling bond attributing to the generation of the free electrons, while hydrogen is in ZnO. Therefore, the hydrogen addition also allows reduction of the free electrons. Such reduction of the free electrons allows decrease of the fermi level to the vicinity of the center of the band gap. This allows decrease of a gate voltage required for removal of such too many free electrons, with the result that the threshold voltage of the semiconductor device is increased. As such, the threshold voltage, which is one of important properties of a transistor, can be so controlled as to be a voltage allowing for practical use of the semiconductor device.

It is preferable to arrange the semiconductor device such that each of the elements corresponds to nitrogen, phosphorus, arsenic, or stibium; or the elements correspond to not less than two of nitrogen, phosphorus, arsenic, and stibium. The addition of these elements makes it possible that the threshold voltage can be precisely controlled depending on an addition amount such that the threshold voltage falls within a relatively large range.

It is preferable to arrange the semiconductor device such that: the elements corresponds to (i) hydrogen and (ii) nitrogen, phosphorus, arsenic, stibium, or not less than two of nitrogen, phosphorus, arsenic, and stibium. The addition of these elements makes it possible to control the threshold voltage of the semiconductor device depending on the addition amount such that the threshold voltage falls within a relatively large range. Further, in the manufacturing of the semiconductor device, the active layer is formed under an atmosphere containing (i) one or more of nitrogen, dinitrogen monoxide, nitrogen monoxide, and nitrogen dioxide, and (ii)

one or more of water vapor, hydrogen peroxide, and ammonia. With this, nitrogen and hydrogen are added to the active layer to be formed.

It is preferable to arrange the semiconductor device such that the blocking member is made up of different blocking layers. As described above, the blocking member may be made up of a plurality of blocking layers as long as the active layer can be blocked from the atmosphere by such a blocking member. Therefore, such a blocking member made up of the blocking layers makes it possible to easily apply the present invention to a thin film transistor etc., including an insulating layer, an electrode, an protective layer, and the like, which respectively serve as the blocking layers.

It is preferable to arrange the semiconductor device such that: at least one of the blocking layers is made of $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, a mixed crystal of $LiGaO_2$ such as $(Li_{1-(x+y)}Na_xK_y)(Ga_{1-z}Al_z)O_2$, or a solid solution containing at least two of them. Each of the materials matches well with the ZnO and the $Mg_xZn_{1-x}O$, so that the material is suitable for a blocking layer directly meeting the active layer.

It is preferable to arrange the semiconductor device such that: a blocking layer constituting the blocking layers is made of $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, a mixed crystal of $LiGaO_2$ such as $(Li_{1-(x+y)}Na_xK_y)(Ga_{1-z}Al_z)O_2$, or a solid solution containing at least two of them, and the blocking layer is so provided as to meet the active layer separately from (i) each of two electrodes serving as blocking layers and connected to the active layer, and (ii) an insulating layer, which serves as a blocking layer and meets the active layer, for insulating the active layer from a control electrode for controlling move of a movable electric charge in the active layer. The two electrodes connected to the active layer correspond to, e.g., a source electrode and a drain electrode of a thin film transistor, respectively. Moreover, the control electrode corresponds to a gate electrode thereof. In an inverse-staggered thin film transistor, a gate electrode is formed on a substrate. Formed on the gate electrode is a gate insulating layer (blocking layer). On the gate insulating layer, the active layer is formed. The blocking layer meeting the active layer separately from the gate insulating layer is such a blocking layer (corresponding to the protective layer 8 shown in FIG. 1(a) through FIG. 1(c)) that meets (i) the upper end surface of the active layer, and (ii) a part of the side end surface thereof. The upper end surface of the active layer refers to a surface positioned between the source electrode and the drain electrode. As such, the structure is provided with the blocking layer which is provided separately from the electrodes and the insulating layer each required for such a semiconductor device, and which serves as a protective layer for blocking the active layer from the atmosphere. Moreover, the blocking layer directly meeting the above region is made of each of the aforementioned materials that match well with the ZnO and the $Mg_xZn_{1-x}O$ as described above. This makes it possible to stabilize the element property of the semiconductor device.

It is preferable to arrange the semiconductor device such that at least one of the blocking layers is made of resin. A blocking layer made of resin can be formed with the use of an existing resin formation device. Accordingly, a complex film formation process is not required for the formation of the blocking layer. This makes it easier to manufacture the semiconductor device. This allows reduction of manufacturing cost of the semiconductor device. Further, the use of the resin allows improvement of flexibility of the semiconductor device. This is especially suitable in cases where a flexible substrate is used as the substrate of the semiconductor device.

It is preferable to arrange the semiconductor device such that: a blocking layer constituting the blocking layers is made of resin, and the blocking layer is so provided as to meet the active layer separately from (i) each of two electrodes serving as blocking layers and connected to the active layer, and (ii) an insulating layer, which serves as a blocking layer and meets the active layer, for insulating the active layer from a control electrode for controlling move of a movable electric charge in the active layer. The two electrodes connected to the active layer correspond to, e.g., a source electrode and a drain electrode of a thin film transistor, respectively. Moreover, the control electrode corresponds to a gate electrode thereof. In an inverse-staggered thin film transistor, the blocking layer meeting the active layer separately from the gate insulating layer is such a blocking layer (corresponding to the protective layer 8 shown in FIG. 1(a) through FIG. 1(c)) that meets (i) the upper end surface of the active layer, and (ii) a part of the side end surface thereof, as described above. The upper end surface of the active layer refers to a surface positioned between the source electrode and the drain electrode. As such, the structure is provided with the blocking layer which is provided separately from the electrodes and the insulating layer each required for such a semiconductor device, and which serves as a protective layer for blocking the active layer from the atmosphere. Moreover, the blocking layer directly meeting the region can be made of a resin. This makes it possible to reduce the manufacturing cost of the semiconductor device as described above.

An electronic device of the present invention includes, as a switching element, any one of the semiconductor devices described above. A performance of the electronic device can be improved by the high performance semiconductor device which uses the transparent ZnO and $Mg_xZn_{1-x}O$ for the active layer, and which is provided as the switching element.

It is preferable to arrange the electronic device such that the switching element is connected to a picture element electrode such that an image signal is written in or read out from the picture element electrode. In an active matrix type display device (e.g., a liquid crystal display device or an organic EL display device) serving as the electronic device, the switching element is turned ON when the image signal is supplied from a driving circuit to the picture element electrode. Further, in an image sensor serving as the electronic device, the switching element is turned ON when reading out the image signal captured in the picture element electrode. As such, the semiconductor device can be used as the switching element in the image displaying electronic device or the image capturing electronic device. This makes it possible for such electronic devices to have high performance with ease.

As described above, the semiconductor device of the present invention includes: (1) an active layer, to which group I elements, group III elements, group IV elements, group V elements, or group VII elements are added, and which is made of a semiconductor containing (i) polycrystalline ZnO or polycrystalline $Mg_xZn_{1-x}O$, (ii) amorphous ZnO or amorphous $Mg_xZn_{1-x}O$, or (iii) either (a) mixture of the polycrystalline ZnO and the amorphous ZnO or (b) mixture of the polycrystalline $Mg_xZn_{1-x}O$ and the amorphous $Mg_xZn_{1-x}O$; and (2) a blocking member for blocking the active layer such that the region, in which the movable charges move, of the active layer is not influenced by the atmosphere.

In this way, the ZnO or the $Mg_xZn_{1-x}O$ each sensitive to the atmosphere is blocked from the atmosphere. Moreover, the group I elements, the group III elements, the group IV elements, or the group V elements are added to the ZnO or the $Mg_xZn_{1-x}O$. This allows reduction of the movable charges generated in the active layer by the blocking layer. This makes it possible to provide a semiconductor device whose element property is stable and is never influenced by the atmosphere, and which uses the ZnO or the $Mg_xZn_{1-x}O$ by each of which the threshold voltage can be so controlled as to fall within a voltage range allowing for the practical use of the semiconductor device.

Additional objects, features, and strengths of the present invention will be made clear by the description below. Further, the advantages of the present invention will be evident from the following explanation in reference to the drawings.

BEST MODE FOR CARRYING OUT THE INVENTION

Figure 1:
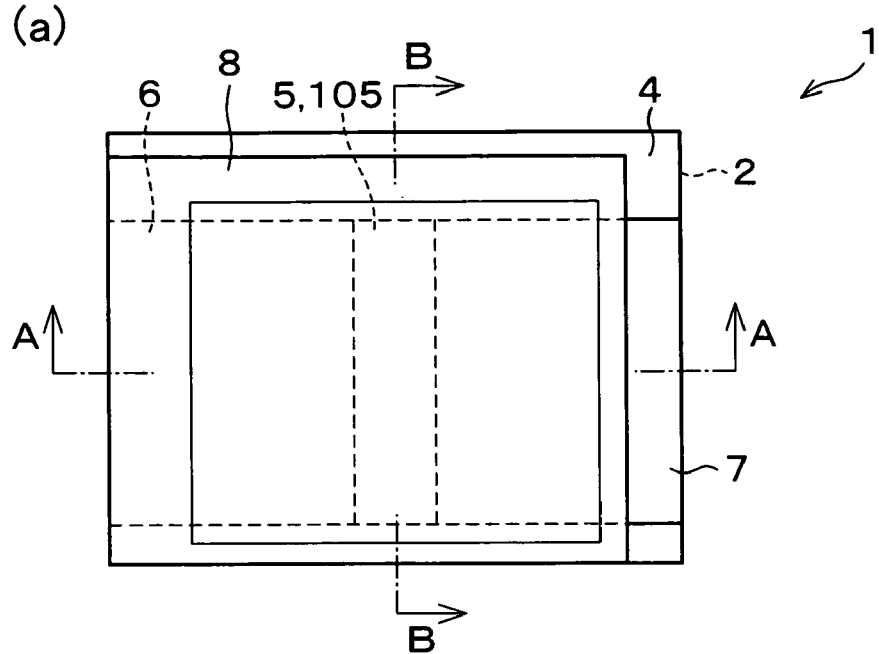
FIG. 1(a) is a plan view illustrating a structure of a thin film transistor according to Embodiment 1 of the present invention.
FIG. 1(b) is a cross sectional view taken along A-A line of FIG. 1(a).
FIG. 1(c) is a cross sectional view taken along B-B line of FIG. 1(a).
Figure 1:
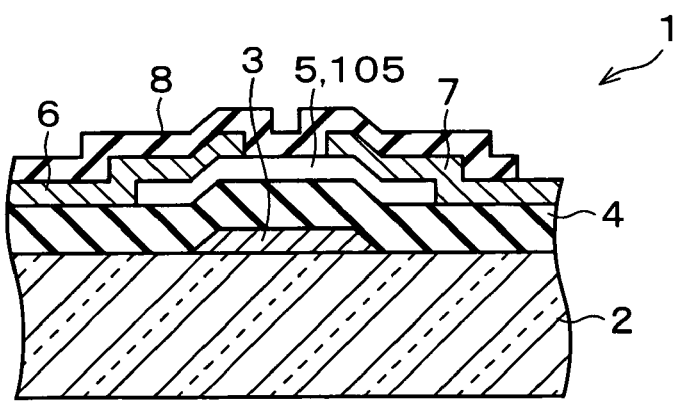
Figure 1:
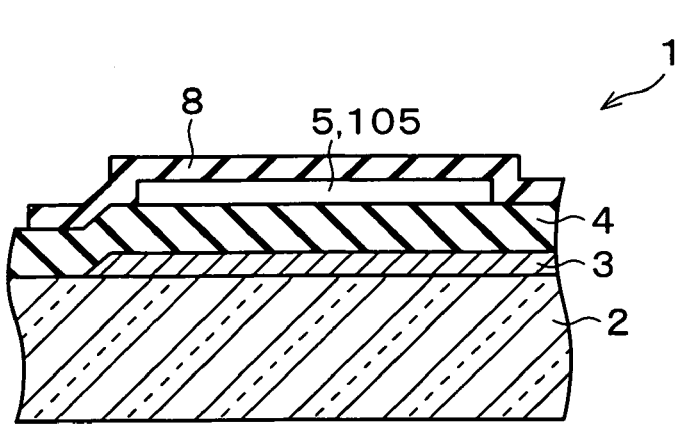

The following explains the present invention more in detail, with reference to examples and comparative examples; however, the present invention is not limited to these.

Embodiment 1

Embodiment 1 of the present invention will be explained below with reference to FIG. 1 through FIG. 5.

FIG. 1(a) is a plan view illustrating a thin film transistor 1 according to the present embodiment. FIG. 1(b) is a cross sectional view taken along line A-A of FIG. 1(a). FIG. 1(c) is a cross sectional view taken along line B-B of FIG. 1(a). Note that, although FIG. 1(b) and FIG. 1(c) describes rise and recess each formed in the central portion of the surface of a protective layer 8, FIG. 1(a) does not describe the rise and the recess for the sake of simplicity.

As shown in FIG. 1(a) through FIG. 1(c), the thin film transistor 1 serving as a semiconductor device has the inverse staggered structure. Specifically, a gate electrode 3 is formed on an insulating substrate 2. On the insulating substrate 2 and the gate electrode 3, a gate insulating layer 4 is provided. Provided on the gate insulating layer 4 is a semiconductor layer 5. Provided on the semiconductor layer 5 and the gate insulating layer 4 are: a source electrode 6 and a drain electrode 7 each serving as an electrode section. Further, a protective layer 8 is so provided as to cover the semiconductor layer 5, the source electrode 6, and a part of the drain electrode 7.

Further, in cases where the thin film transistor 1 is used for a display device such as an active matrix liquid crystal display device of Embodiment 4, the drain electrode 7 is connected to a picture element electrode. Alternatively, the drain electrode 7 is formed in one piece with the picture element electrode, by way of a transparent conductive film. Therefore, the part of the drain electrode 7 is not covered with the protective layer 8.

Figure 2:
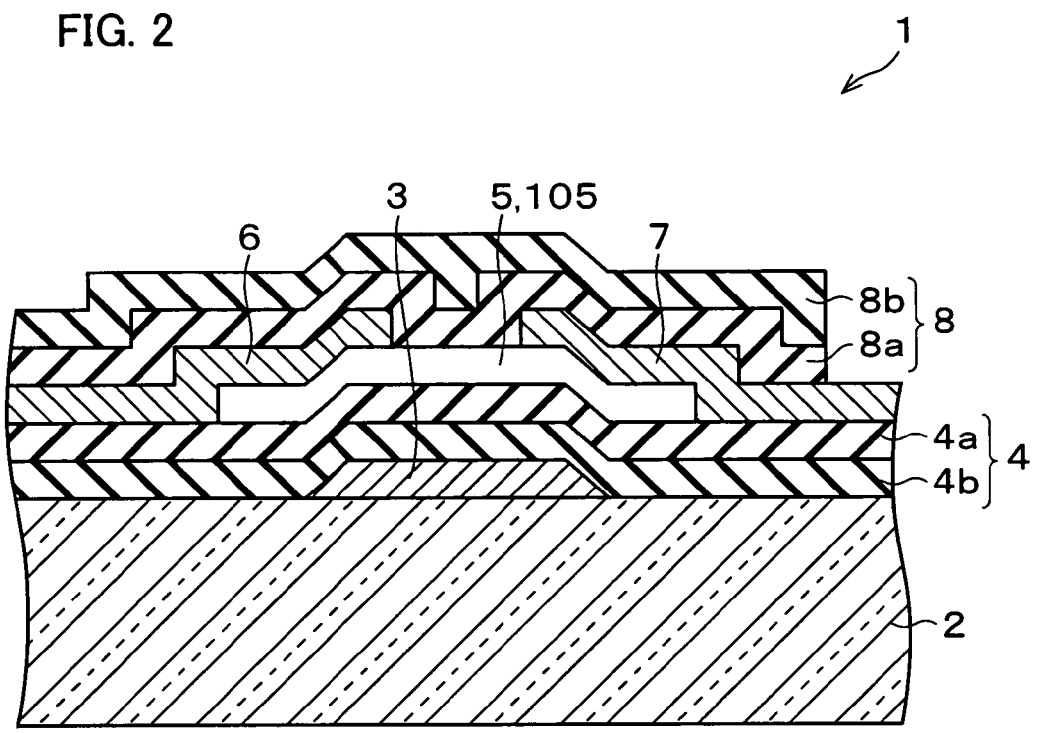
FIG. 2 is a cross sectional view illustrating another structure of the thin film transistor according to Embodiment 1.
Figure 3:
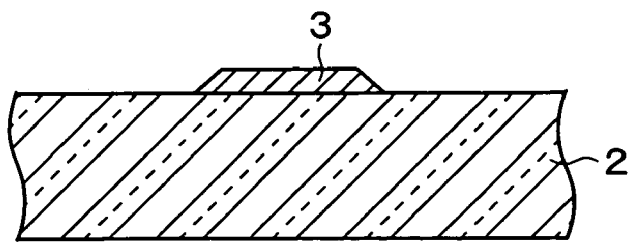
FIG. 3(a) is a cross sectional view illustrating a gate wire formation process in manufacturing the thin film transistor shown in FIG. 1.
FIG. 3(b) is a cross sectional view illustrating a gate insulating film formation process in manufacturing the thin film transistor shown in FIG. 1.
FIG. 3(c) is a cross sectional view illustrating a semiconductor layer formation process in manufacturing the thin film transistor shown in FIG. 1.
FIG. 3(d) is a cross sectional view illustrating process of forming a source electrode and a drain electrode, in manufacturing the thin film transistor shown in FIG. 1.
FIG. 3(e) is a cross sectional view illustrating a final process in manufacturing the thin film transistor shown in FIG. 1.
Figure 3:
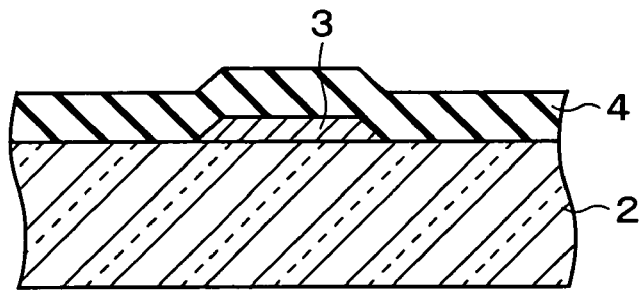
Figure 3:
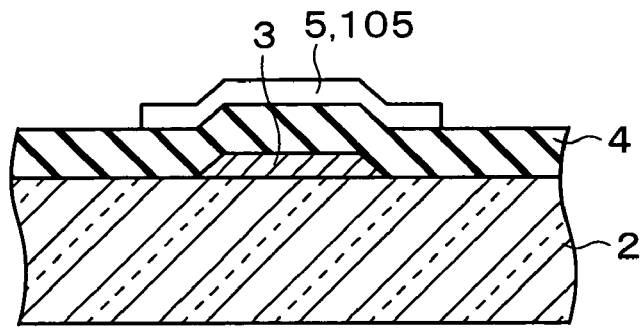
Figure 3:
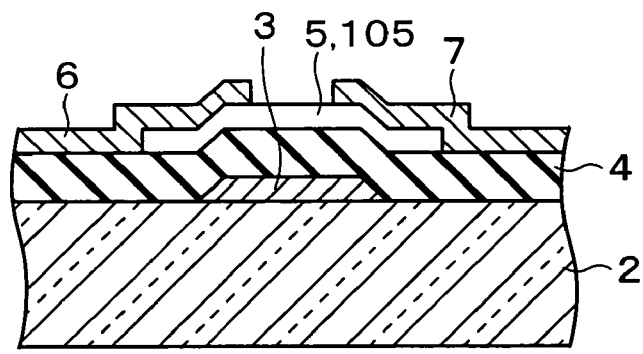
Figure 3:
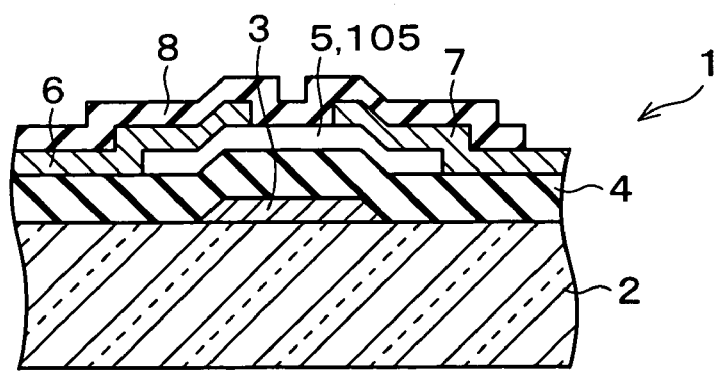

The gate insulating layer 4 is made of an insulator. Examples of the insulator includes: $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of the insulators. Each of the insulators matches well with ZnO and $Mg_xZn_{1-x}O$. Further, the gate insulating layer 4 may be made up of a plurality of layers made of the above insulators. For example, the gate insulating layer 4 may be made up of a first insulating layer 4a and a second insulating layer 4b as shown in FIG. 2. In such a structure, the first insulating layer 4a is made of an insulator having a good interface property with the semiconductor layer 5, such as $Al_2O_3$, AlN, and MgO. On the other hand, the second insulating layer 4b is made of an insulator having a good insulation performance, such as $SiO_2$. The gate insulating layer 4 thus obtained on the insulating substrate 2 is highly reliable.

The semiconductor layer 5 serves as an active layer, and is made of a semiconductor containing (i) polycrystalline ZnO or polycrystalline $Mg_xZN_{1-x}O$; (ii) amorphous ZnO or amorphous $Mg_xZN_{1-x}O$; or (iii) either mixture of the polycrystalline ZnO and the amorphous ZnO, or mixture of the polycrystalline $Mg_xZN_{1-x}O$ and the amorphous $Mg_xZN_{1-x}O$. A group I element, a group III element, a group IV element, a group V element, or a group VII element is added to the semiconductor. Each of the group I element and the group V element is preferable for the element to be added thereto. For example, the semiconductor layer 5 is made of (i) a semiconductor which contains nitrogen (N), phosphorus (P), arsenic (As), stibium (Sb), or not less than two of these elements, and which contains the polycrystalline ZnO or the polycrystalline $Mg_xZN_{1-x}O$; (ii) a semiconductor which contains nitrogen (N), phosphorus (P), arsenic (As), stibium (Sb), or not less than two of these elements, and which contains the amorphous ZnO or the amorphous $Mg_xZN_{1-x}O$; or (iii) a semiconductor which contains nitrogen (N), phosphorus (P), arsenic (As), stibium (Sb), or not less than two of these elements, and which contains either (a) the mixture of the polycrystalline ZnO and the amorphous ZnO, or (b) the mixture of the polycrystalline $Mg_xZN_{1-x}O$ and the amorphous $Mg_xZN_{1-x}O$.

The protective layer 8 covers a portion of the semiconductor layer 5. The source electrode 6 and the drain electrode 7 are not provided on the portion (the portion is not covered with the source electrode 6 and the drain electrode 7), and the portion does not meet (form an interface with) the gate insulating layer 4. The protective layer 8 is made of $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, a mixed crystal of $LiGaO_2$ such as $(Li_{1-(x+y)}Na_xK_y)(Ga_{1-z}Al_z)O_2$, or a solid solution containing at least two of them.

Alternatively, the protective layer 8 may be made of a resin such as acryl. Such a protective layer 8 made of the resin can be formed with the use of an existing resin formation device. Accordingly, a complex film formation process is not required for the formation of the protective layer 8. This makes it easier to manufacture the thin film transistor 1. This allows reduction of manufacturing cost of the thin film transistor 1. Further, the use of the resin allows improvement of flexibility of the thin film transistor 1. This is especially suitable in cases where a flexible substrate is used as the insulating substrate 2.

Further, the protective layer 8 may be made up of a plurality of layers made of the aforementioned insulators. For example, as shown in FIG. 2, the protective layer 8 is made up of two layers: a first protective layer 8a and a second protective layer 8b. In such a structure, the first protective layer 8a is made of an insulator ($Al_2O_3$, AlN, or MgO) which allows a good interface property with the semiconductor layer 5, and the second protective layer 8b is made of an insulator ($SiO_2$) which blocks the semiconductor layer 5 from the atmosphere well. The protective layer 8 thus obtained is highly reliable.

In the thin film transistor 1, the gate insulating layer 4, the source electrode 6; the drain electrode 7, and the protective layer 8 forms a blocking member, i.e., respectively serve as blocking layers.

Explained here is a method for manufacturing the thin film transistor 1 arranged as above, with reference to FIG. 3(a) through FIG. 3(e) respectively illustrating processes of the manufacturing thereof.

Firstly, sputtering is carried out such that Ta, which is a material (gate electrode material) of the gate electrode 3, is so provided on the insulating substrate 2 as to have a thickness of approximately 300 nm. Then, a resist pattern having a predetermined shape is formed on the gate electrode material in accordance with the photolithography process. The gate electrode material is subjected to dry etching using $CF_4+O_2$ gas, with the use of the resist pattern thus formed. This allows formation of (i) the gate electrode 3 obtained by patterning the gate electrode material in accordance with the resist pattern, and (ii) a gate wire (not shown) connected to the gate electrode 3 (see FIG. 3(a)). Examples of the insulating substrate 2 include: a glass substrate, a quartz substrate, a plastic substrate, and the like. Examples of the gate electrode material include: Ta, Al, Cr, and the like.

Next, $Al_2O_3$ is provided as the gate insulating layer 4 in accordance with the pulse laser deposition method so as to have a thickness of approximately 500 nm, for example. The formation of such a $Al_2O_3$ thin film is carried out in the following conditions (1) through (4): (1) a substrate temperature is set at 300° C., (2) the film forming is carried out under vacuum oxygen atmosphere, (3) a laser power is set at 3.0 $J/cm^2$, and (4) a repetition frequency is set at 10 Hz (see FIG.

3(b)). Note that the material of the gate insulating layer 4 is Al$_2$O$_3$ here; however, each of the aforementioned insulators may be used for the material.

After the Al$_2$O$_3$ deposition, the following is carried out for the purpose of forming the semiconductor 5 continuously. For example, polycrystalline ZnO to which nitrogen is doped is so formed in accordance with the pulse laser deposition method as to have a thickness of approximately 50 nm. The deposition is carried out under the following conditions (1) through (4): (1) the substrate temperature is set at 300° C., (2) the film forming is carried out under mixture atmosphere of vacuum oxygen and nitrogen monoxide, (3) the laser power is set at 1.1 J/cm$^2$, and (4) the repetition frequency is set at 10 Hz. With this method, a layer of ZnO to which nitrogen is doped is formed. Note that nitrogen monoxide is used as a nitrogen source here; however, a gas including nitrogen such as dinitrogen monoxide, nitrogen dioxide, and ammonia may be used for the nitrogen source. Note also that the material of the semiconductor layer 5 is ZnO here; however, ZnO (Mg$_x$Zn$_{1-x}$O) containing Mg may be used as the material. Further, the ZnO and the ZnO containing Mg may be amorphous, polycrystalline, or amorphous and polycrystalline.

A resist pattern having a predetermined shape is formed, in accordance with the photolithography process, on the ZnO layer to be the semiconductor layer 5. Then, wet etching using nitric acid, acetic acid, or the like is carried out with respect to the ZnO layer, with the use of the resist pattern thus formed. Accordingly, the semiconductor layer 5 having the predetermined shape is obtained (see FIG. 3(c)).

Next, Al is so provided as to have a thickness of approximately 200 nm, in accordance with the sputtering method. Then, the layer of Al is subjected to photolithography and dry etching using Cl$_2$ gas so as to be patterned. Accordingly, the source electrode 6 and the drain electrode 7 are formed (see FIG. 3(d)).

Further, Al$_2$O$_3$ is so formed in accordance with the pulse laser deposition method as to have a thickness of approximately 200 nm. The layer of Al$_2$O$_3$ is subjected to ion milling using a predetermined resist pattern made in accordance with photolithography, with the result that an irrelevant part of the Al$_2$O$_3$ layer is removed. This allows formation of the protective layer 8, with the result that the manufacturing of the thin film transistor 1 is completed (see FIG. 3(e)). Note that the material (insulator) of the protective layer 8 is Al$_2$O$_3$ here; however, the material may be each of the aforementioned insulators. Moreover, the protective layer 8 may be made up of a plurality of layers of the aforementioned insulators.

Figure 4:
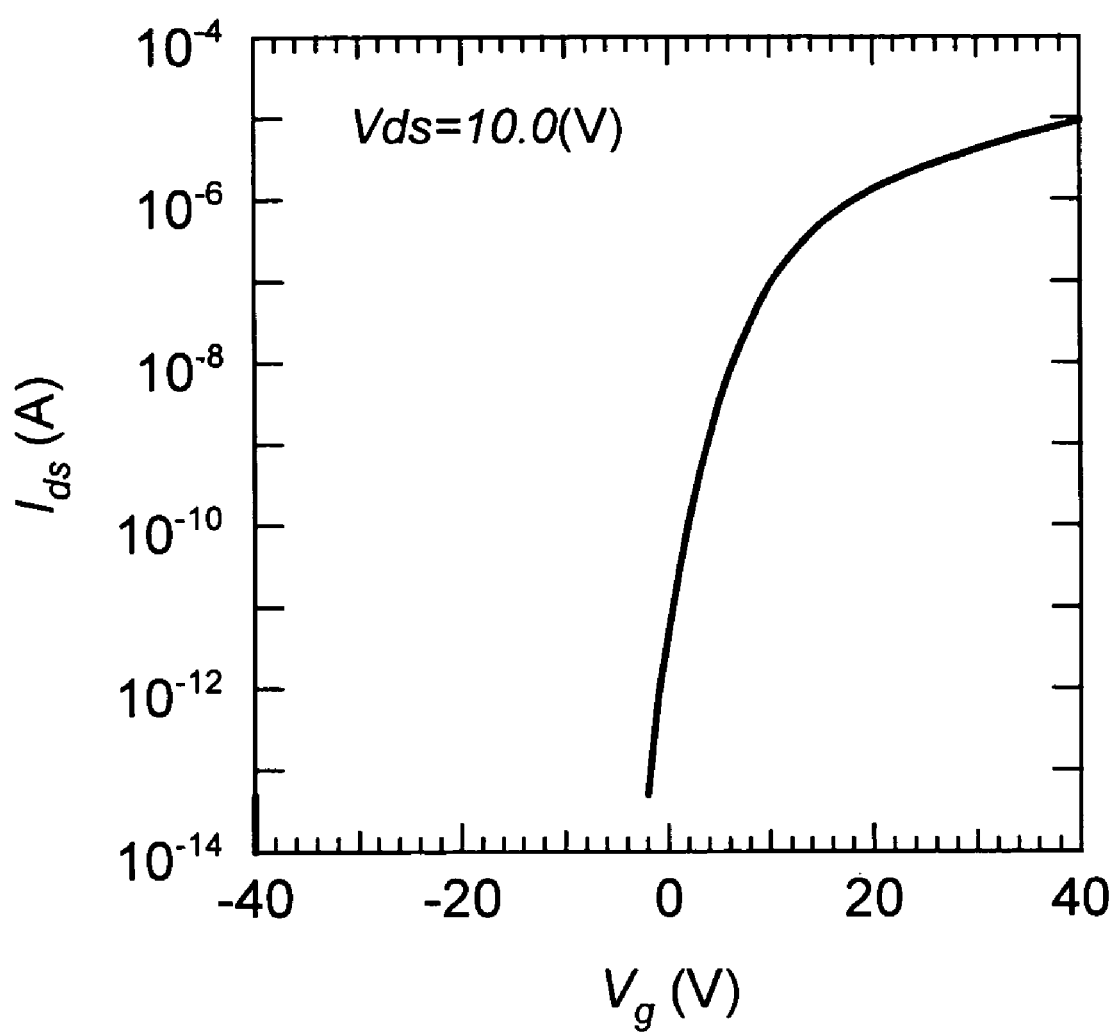
FIG. 4 is a diagram illustrating the $I_d$-$V_g$ property of each thin film transistor according to Embodiments 1 through 3.
Figure 15:
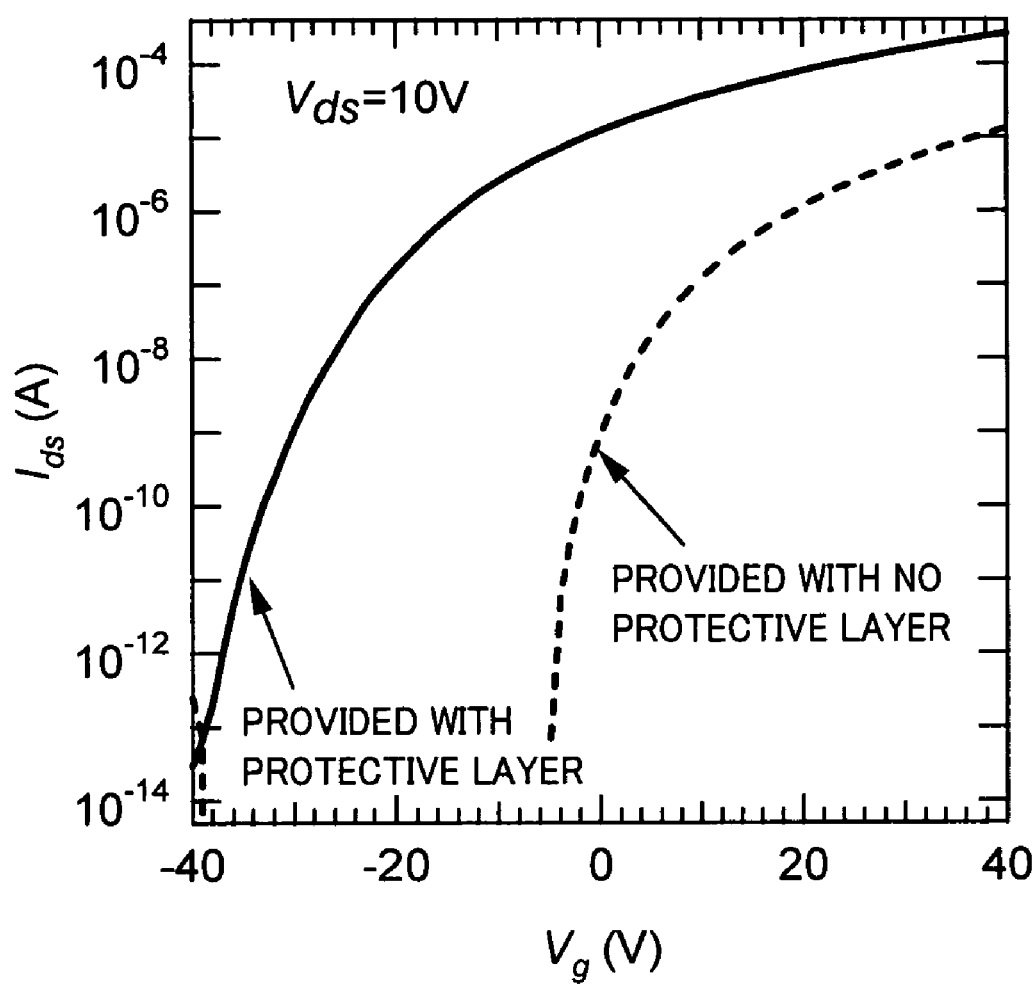
FIG. 15 is a diagram illustrating (i) the $I_d$-$V_g$ property of the thin film transistor having the protective layer, and (ii) the $I_d$-$V_g$ property of the thin film transistor having no protective layer.
Figure 16:
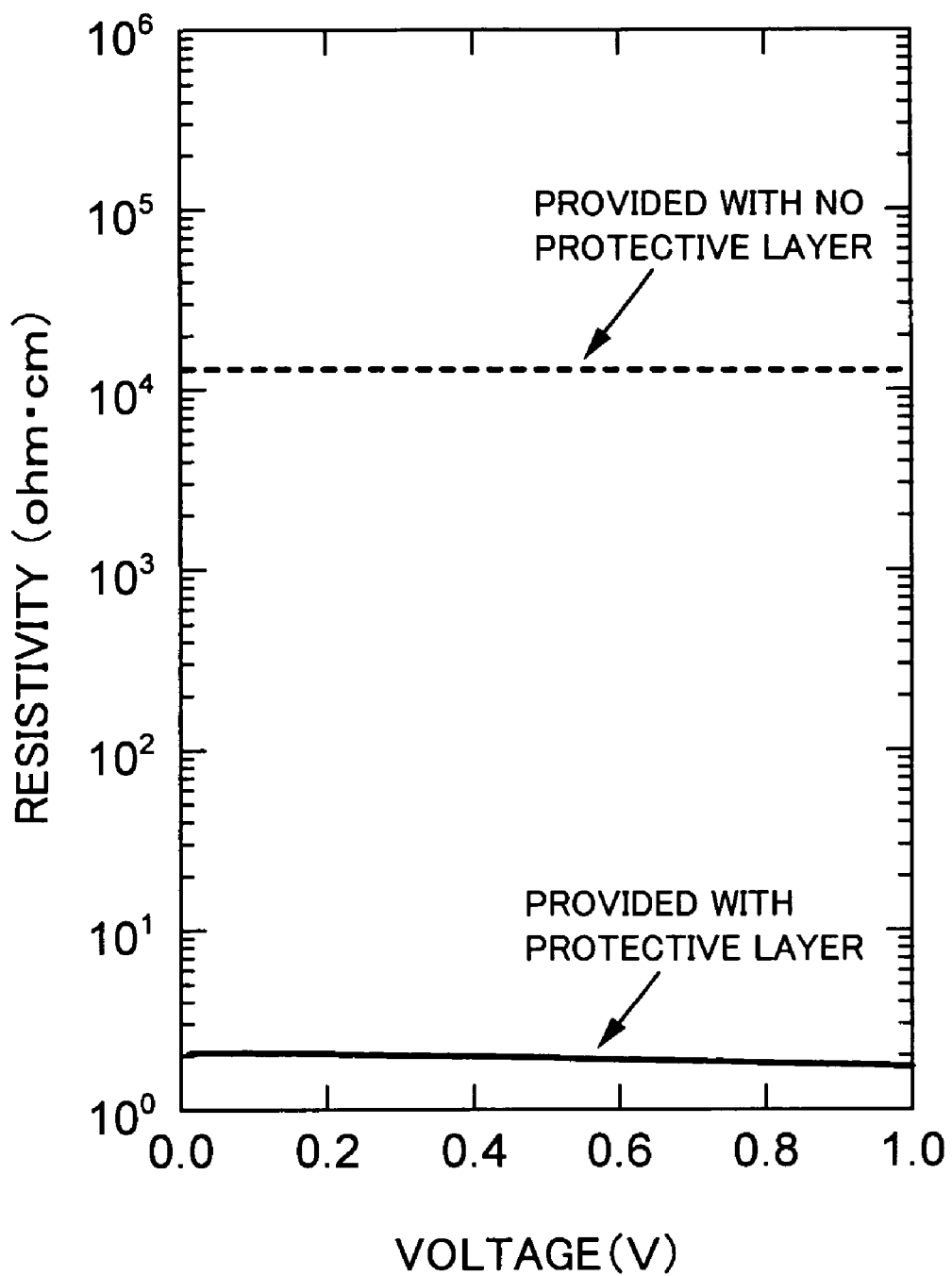
FIG. 16 is a diagram illustrating (i) the voltage-resistivity property of an zinc oxide film of the thin film transistor having the protective layer, and (ii) the voltage-resistivity property of an zinc oxide film of the thin film transistor having no protective layer.

FIG. 4 illustrates the I$_d$-V$_g$ property of the thin film transistor 1 manufactured as above. Compare the I$_d$-V$_g$ property shown in FIG. 4 with the I$_d$-V$_g$ property (see FIG. 15) of the thin film transistor which has the protective layer and which uses ZnO to which no nitrogen is doped. The comparison clarifies that the thin film transistor 1 has a threshold voltage V$_{th}$ of on the order of 0 V. As such, the doping of nitrogen into ZnO makes it possible that the threshold voltage V$_{th}$ of the thin film transistor 1 having the protective layer 8 is so controlled as to be a voltage practically causing no problem. Especially, depending on the doping amount, the threshold voltage can be controlled to be increased from a negative voltage up to approximately +10 V.

It is understood why the threshold voltage V$_{th}$ is controlled by doping nitrogen into ZnO, as follows. That is, the formation of the protective layer causes decrease of the surface level of the ZnO layer. This causes elimination of the band-bending spread over the depletion layer formed within the ZnO layer. Accordingly, the ZnO layer becomes the n-type semiconductor indicating the intrinsic resistance, with the result that too many free electrons are generated. Nitrogen is a group V element, so that nitrogen works as an acceptor impurity. Therefore, the doping of nitrogen allows reduction of such too many free electrons, with the result that the fermi level is decreased to the vicinity of the center of the band-gap. This allows decrease of the gate voltage required for removal of the too many free electrons, with the result that the threshold voltage becomes on the order of 0 V.

This is also true when another group V element such as P, As, or Sb is used. Specifically, see an example in which a Zn compound containing a group V element such as Zn$_2$P$_3$, Zn$_2$As$_3$, or Zn$_2$Sb$_3$ is used as a target for the doping, and in which the semiconductor layer 5 is formed in the following conditions (1) through (3): (1) the substrate temperature is set at 300° C., (2) the film forming is carried out under vacuum oxygen atmosphere, and (3) the laser power is set at 1.1 J/cm$^2$. With this, the threshold voltage V$_{th}$ can be so controlled as to be on the order of 0V. Moreover, depending on the doping amount, the threshold voltage can be controlled to be increased from a negative voltage up to approximately +10 V. This is the same as the case where nitrogen is used for the doping. Of course, the threshold voltage V$_{th}$ can be controlled in the same manner in accordance with the above method when Zn$_2$N$_3$ is used as the target for the doping.

Further, the threshold voltage V$_{th}$ can be controlled in a similar manner when doping a group I element, a group III element, a group IV element, or a group VII element into a semiconductor containing (i) the polycrystalline ZnO or the polycrystalline Mg$_x$ZN$_{1-x}$O; (ii) the amorphous ZnO or the amorphous Mg$_x$ZN$_{1-x}$O; or (iii) either the mixture of the polycrystalline ZnO and the amorphous ZnO, or the mixture of the polycrystalline Mg$_x$ZN$_{1-x}$O and the amorphous Mg$_x$ZN$_{1-x}$O.

Figure 5:
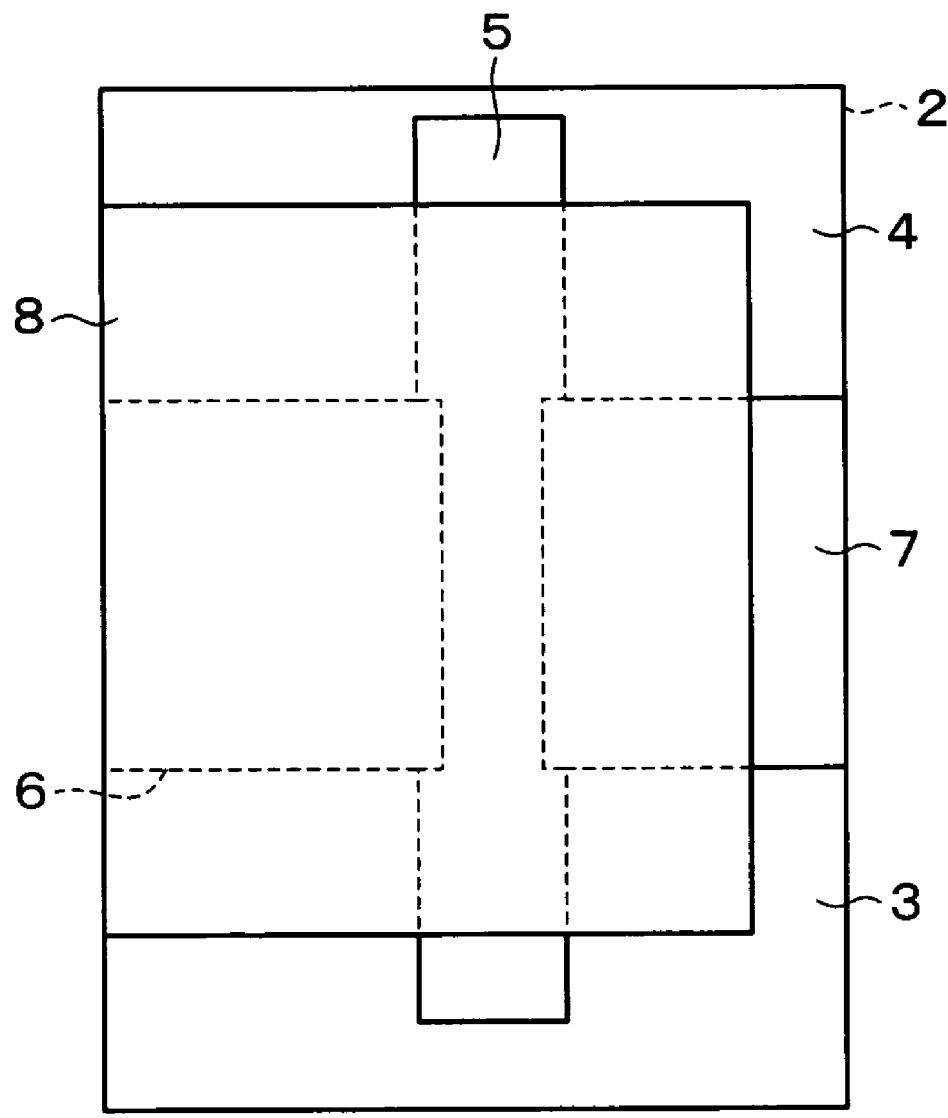
FIG. 5 is a plan view illustrating still another structure of the thin film transistor according to Embodiment 1.

Note that the semiconductor layer 5 is wholly covered with the protective layer 8 in the structure shown in FIG. 1(a); however, the semiconductor layer 5 does not need to be wholly covered with the protective layer 8 as long as a channel portion (a region in which a carrier (movable charge) moves) of the semiconductor layer 5 of the thin film transistor 1 is not influenced by the atmosphere. For example, see FIG. 5 illustrating a structure in which the semiconductor 5 extends in the direction of the channel width and has end portions which are not covered with the protective layer 8 and which are exposed to the atmosphere. In such a structure, the end portions are influenced by the atmosphere; however, in cases where the channel portion is distant away from the end portions so as to be free from the influence, the semiconductor layer 5 does not need to be covered wholly with the protective layer 8 and the gate insulating layer 4.

Embodiment 2

Embodiment 2 of the present invention will be explained below with reference to FIG. 6 through FIG. 8.

FIG. 6(a) is a plan view illustrating a thin film transistor 11 according to the present embodiment. FIG. 6(b) is a cross sectional view taken along line C-C of FIG. 6(a). FIG. 6(c) is a cross sectional view taken along line D-D of FIG. 6(a). Note that, although FIG. 6(b) and FIG. 6(c) describes rise and recess each formed in the central portion of the surface of a protective layer 19, FIG. 6(a) does not describe the rise and the recess for the sake of simplicity.

Figure 6:
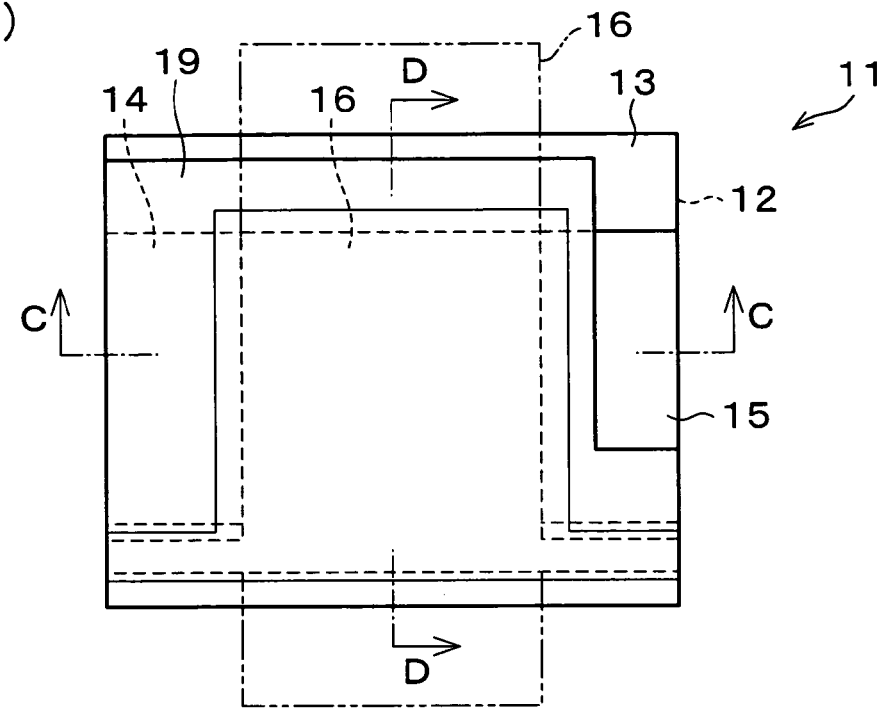
FIG. 6(a) is a plan view illustrating a structure of a thin film transistor according to Embodiment 2 of the present invention.
FIG. 6(b) is a cross sectional view taken along C-C line of FIG. 6(a).
FIG. 6(c) is a cross sectional view taken along D-D line of FIG. 6(a).
Figure 6:
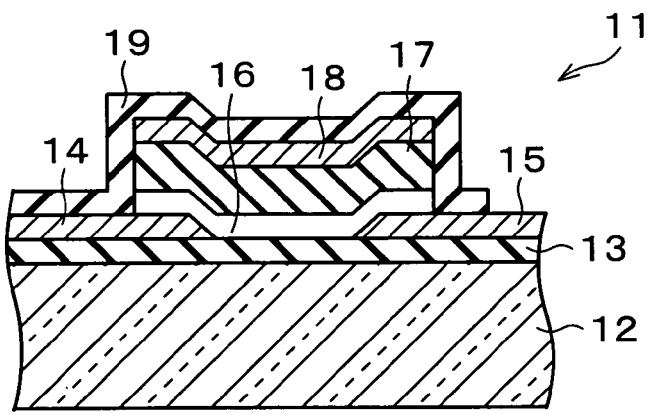
Figure 6:
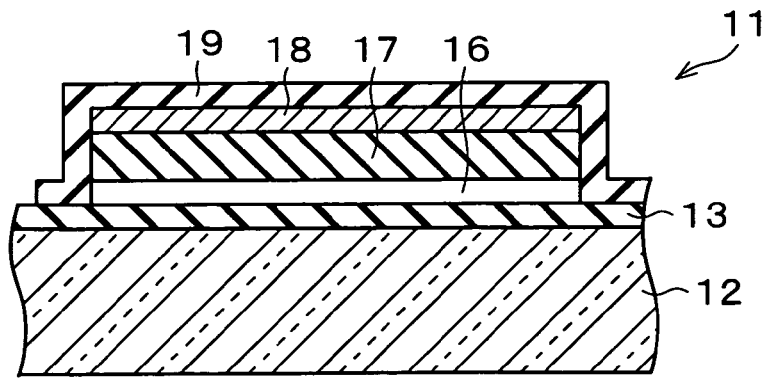

As shown in FIG. 6(a) through FIG. 6(c), the thin film transistor 11 serving as a semiconductor device has the staggered structure. Specifically, a priming insulating layer 13 is formed on an insulating substrate 12. A source electrode 14 and a drain electrode 15 are formed on the priming insulating layer 13 with a space therebetween. Formed on and above the source electrode 14, the drain electrode 15, and the priming insulating layer are a semiconductor layer 16, a gate insulating layer 17, and a gate electrode 18 in this order. Further, the protective layer 19 is so formed as to cover the semiconductor layer 16, the gate insulating layer 17, and the gate electrode 18. In the thin film transistor 11, the semiconductor layer 16, the gate insulating layer 17, and the gate electrode 18 are patterned to have the same shape (see the shape of the semiconductor layer 16 in FIG. 6($a$)), and are formed on top of one another.

Further, in cases where the thin film transistor 11 is used for a display device such as the active matrix liquid crystal display device of Embodiment 4, the drain electrode 15 is connected to the picture element electrode. Alternatively, the drain electrode 15 is formed in one piece with the picture element electrode, by way of a transparent conductive film.

The priming insulating layer 13 is made of an insulator. Examples of the insulator includes: $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of the insulators. The priming insulating layer 13 meets a region of the bottom surface of the semiconductor layer 16. The region does not meet the source electrode 14 and the drain electrode 15.

Alternatively, the priming insulating layer 13 may be made of a resin such as acryl. Such a priming insulating layer 13 made of the resin can be formed with the use of an existing resin formation device. Accordingly, a complex film formation process is not required for the formation of the priming insulating layer 13. This makes it easier to manufacture the thin film transistor 11. This allows reduction of manufacturing cost of the thin film transistor 11. Further, the use of the resin allows improvement of flexibility of the thin film transistor 11. This is especially suitable in cases where a flexible substrate is used as the insulating substrate 12.

Further, the priming insulating layer 13 may be made up of a plurality of layers made of the aforementioned insulators. For example, as shown in FIG. 7, the priming insulating layer 13 is made up of two layers: a first insulating layer 13$a$ and a second insulating layer 13$b$. In such a structure, the first insulating layer 13$a$ is made of an insulator ($SiO_2$) which allows a good interface property with the insulating substrate 12, and the second protective layer 8$b$ is made of an insulator ($Al_2O_3$, AlN, or MgO) that allows a good interface property with the semiconductor layer 16. The priming insulating layer 13 thus obtained is highly reliable.

In cases where the insulating substrate 12 is made of glass or quartz, the semiconductor layer 16 is covered with either $SiO_2$ or an insulator containing $SiO_2$ even when no priming insulating layer 13 is provided. This is because glass or quartz contains either $SiO_2$ or such an insulator. Accordingly, the semiconductor layer 16 is blocked from the atmosphere.

The semiconductor layer 16 serving as an active layer is made of a semiconductor containing (i) polycrystalline ZnO or polycrystalline $Mg_xZN_{1-x}O$; (ii) amorphous ZnO or amorphous $Mg_xZN_{1-x}O$; or (iii) either mixture of the polycrystalline ZnO and the amorphous ZnO, or mixture of the polycrystalline $Mg_xZN_{1-x}O$ and the amorphous $Mg_xZN_{1-x}O$. A group I element, a group III element, a group IV element, a group V element, or a group VII element is added to the semiconductor. Each of the group I element and the group V element is preferable for the element to be added thereto. For example, the semiconductor layer 16 is made of (i) a semiconductor which contains nitrogen (N), phosphorus (P), arsenic (As), stibium (Sb), or not less than two of these elements, and which contains the polycrystalline ZnO or the polycrystalline $Mg_xZN_{1-x}O$; (ii) a semiconductor which contains nitrogen (N), phosphorus (P), arsenic (As), stibium (Sb), or not less than two of these elements, and which contains the amorphous ZnO or the amorphous $Mg_xZN_{1-x}O$; or (iii) a semiconductor which contains nitrogen (N), phosphorus (P), arsenic (As), stibium (Sb), or not less than two of these elements, and which contains either (a) the mixture of the polycrystalline ZnO and the amorphous ZnO, or (b) the mixture of the polycrystalline $Mg_xZN_{1-x}O$ and the amorphous $Mg_xZN_{1-x}O$.

The gate insulating layer 17 meets the semiconductor layer 16, and is made of an insulator. Examples of the insulator includes: $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of the insulators. Further, the gate insulating layer 17 may be made up of a plurality layers made of the above insulators. For example, the gate insulating layer 17 may be made up of a first insulating layer 17$a$ and a second insulating layer 17$b$ as shown in FIG. 7. In such a structure, the first insulating layer 17$a$ is made of an insulator having a good interface property with the semiconductor layer 16, such as $Al_2O_3$, AlN, and MgO. On the other hand, the second insulating layer 17$b$ is made of an insulator having a good insulation performance, such as $SiO_2$. The gate insulating layer 4 thus obtained between the semiconductor layer 16 and the gate electrode 18 is highly reliable.

The protective layer 19 is so formed as to cover the semiconductor layer 16, the gate insulating layer 17, and the gate electrode 18, which are formed on top of one another. The protective layer 19 is made of an insulator. Examples of the insulator include: $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of them.

Alternatively, the protective layer 19 may be made of a resin such as acryl, as is the case with the priming insulating layer 13. This renders the same benefit as the benefit rendered when the priming insulating layer 13 is made of resin.

The protective layer 19 has sidewalls covering the side surfaces, which are surfaces excluding (i) the bottom surface of the semiconductor layer 16, and (ii) the upper surface of the semiconductor layer 16. The bottom surface of the semiconductor layer refers to the surface meeting the priming insulating layer 13, the source electrode 14, and the drain electrode 15. The upper surface thereof refers to the surface meeting the gate insulating layer 17. Further, the protective layer 19 may be made up of a plurality layers made of the aforementioned insulators. For example, as shown in FIG. 7, the protective layer 19 is made up of two layers: a first protective layer 19$a$ and a second protective layer 19$b$. In such a structure, the first protective layer 19$a$ is made of an insulator having a good interface property with the semiconductor layer 16, such as $Al_2O_3$, AlN, and MgO. On the other hand, the second protective layer 19$b$ is made of an insulator blocking the semiconductor layer 16 from the atmosphere well, such as SiO$_2$. The protective layer 19 thus obtained is highly reliable.

In the thin film transistor 11, the priming insulating layer 13, the source electrode 14, the drain electrode 15, the gate insulating layer 17, and the protective layer 19 forms a blocking member, i.e., respectively serve as blocking layers.

Explained here is a method for manufacturing the thin film transistor 11 arranged as above, with reference to FIG. 8(a) through FIG. 8(d) respectively illustrating processes of the manufacturing thereof.

Firstly, Al$_2$O$_3$ is provided on the insulating substrate 12 as the priming insulating layer 13 in accordance with the pulse laser deposition method so as to have a thickness of approximately 100 nm (see FIG. 8(a)). The deposition is carried out in the following conditions (1) through (4): (1) the substrate temperature is set at 300° C. upon the deposition, (2) the film forming is carried out under vacuum oxygen atmosphere, (3) the laser power is set at 3.0 J/cm$^2$, and (4) the repetition frequency is set at 10 Hz. Note that the material of the priming insulating layer 13 is Al$_2$O$_3$ here; however, each of the aforementioned insulators may be used for the material.

Next, Al is so provided on the priming insulating layer 13 as to have a thickness of approximately 150 nm, in accordance with the sputtering method or the like. Then, dry etching is carried out with the use of a resist patterned in a predetermined shape in accordance with photolithography, with the result that an irrelevant part of the Al layer is removed. This allows formation of the source electrode 14 and the drain electrode 15 (see FIG. 8(b)).

Next, the following is carried out for the purpose of forming the semiconductor layer 16. For example, polycrystalline ZnO to which nitrogen is doped is so provided in accordance with the pulse laser deposition method as to have a thickness of approximately 50 nm. The deposition is carried out in the following conditions (1) through (4): (1) the substrate temperature is set at 300° C. upon the deposition, (2) the film forming is carried out under a mixture atmosphere of vacuum oxygen and nitrogen monoxide, (3) the laser power is set at 1.1 J/cm$^2$, and (4) the repetition frequency is set at 10 Hz. With this method, a layer of ZnO to which nitrogen is doped is formed. Note that nitrogen monoxide is used as a nitrogen source here; however, a gas including nitrogen such as dinitrogen monoxide, nitrogen dioxide, and ammonia may be used for the nitrogen source. Note also that N is used here as the impurity to be doped to ZnO; however, P, As, or Sb may be used as the impurity. Note also that the material of the semiconductor layer 16 is ZnO here; however, ZnO (Mg$_x$Zn$_{1-x}$O) containing Mg may be used as the material. Further, the ZnO and the ZnO containing Mg may be amorphous, polycrystalline, or amorphous and polycrystalline.

Formed continuously after the deposition of the semiconductor layer 16 is the gate insulating layer 17. The gate insulating layer 17 is formed, e.g., as follows. That is, Al$_2$O$_3$ is so provided in accordance with the pulse laser deposition method as to have a thickness of approximately 500 nm. The formation of the Al$_2$O$_3$ thin film is carried out in the following conditions (1) through (4): (1) the substrate temperature is set at 300° C., (2) the film forming is carried out under vacuum oxygen atmosphere, (3) the laser power is set at 3.0 J/cm$^2$, and (4) the repetition frequency is set at 10 Hz. Note that Al$_2$O$_3$ is used as the material of the gate insulating layer 17; however, the aforementioned insulators may be used instead.

Thereafter, Al or the like is formed as the gate electrode 18 in accordance with the sputtering method so as to have a thickness of approximately 200 nm. Then, ion milling is carried out with the use of a resist patterned in a predetermined shape in accordance with photolithography, with the result that respective irrelevant parts of the Al layer, the gate insulating layer 17, and the semiconductor layer 16 are removed. With this, the gate electrode 18 is formed on and above the semiconductor layer 16 and the gate insulating layer 17 (see FIG. 8(c)). Here, the respective side surfaces of the gate electrode 18, the gate insulating layer 17, and the semiconductor layer 16 are perpendicular to the upper surface of the insulating substrate 12. However, for attainment of a good coverage by the protective layer 19, the side surfaces may form a forward tapered shape expanding from the gate electrode 18 toward the semiconductor layer 16.

Finally, for example, the protective layer 19 is formed. Specifically, Al$_2$O$_3$ is so formed in accordance with the pulse laser deposition method as to have a thickness of approximately 200 nm. The film forming is carried out in the following conditions (1) through (4): (1) the substrate temperature is set at 300° C., (2) the film forming is carried out under vacuum oxygen atmosphere, (3) the laser power is set at 3.0 J/cm$^2$, and (4) the repetition frequency is set at 10 Hz. Thereafter, ion milling is carried out with the use of a predetermined resist pattern made in accordance with photolithography, with the result that an irrelevant part of the Al$_2$O$_3$ layer is removed. This allows formation of the protective layer 19, with the result that the manufacturing of the thin film transistor 11 is completed (see FIG. 8(d)). Note that the material of the protective layer 19 is Al$_2$O$_3$ here; however, the material may be SiO$_2$, AlN, MgO, Ta$_2$O$_5$, or a solid solution containing at least two of SiO$_2$, AlN, MgO, Ta$_2$O$_5$, and Al$_2$O$_3$.

The thin film transistor 11 thus obtained has the same $I_d$-$V_g$ property as the property shown in FIG. 4. That is, the threshold voltage $V_{th}$ of the thin film transistor 11 is so controlled as to be on the order of 0 V. As such, the threshold voltage $V_{th}$ of the thin film transistor 11 is so controlled as to be a voltage causing practically no problem, by forming the semiconductor layer 16 with the use of the semiconductor obtained by doping nitrogen into ZnO.

Further, as described in Embodiment 1, doping of the other group V element such as P, AS, or Sb makes it possible to control, in the same manner, the threshold voltage $V_{th}$ to be on the order of 0 V.

Further, the threshold voltage $V_{th}$ can be controlled in the same manner when doping a group I element, a group III element, a group IV element, or a group VII element into a semiconductor containing (i) the polycrystalline ZnO or the polycrystalline Mg$_x$ZN$_{1-x}$O; (ii) the amorphous ZnO or the amorphous Mg$_x$ZN$_{1-x}$O; or (iii) either the mixture of the polycrystalline ZnO and the amorphous ZnO, or the mixture of the polycrystalline Mg$_x$ZN$_{1-x}$O and the amorphous Mg$_x$ZN$_{1-x}$O.

Note that the semiconductor layer 16 is wholly covered with the priming insulating layer 13, the source electrode 14, the drain electrode 15, the gate insulating film 17, and the protective layer 19 in the structure shown in FIG. 6(a) through FIG. 6(c); however, the semiconductor layer 16 does not need to be wholly covered as long as a channel portion (a region in which a carrier moves) of the semiconductor layer 16 of the thin film transistor 11 is not influenced by the atmosphere. For example, see chain-double dashed line in FIG. 6(a), illustrating a structure in which: the semiconductor layer 16, the gate insulating layer 17, and the gate electrode 18 each having the same shape extend in the direction of the channel width, and respectively have end portions which are not covered with the protective layer 19 and which are exposed to the atmosphere. In such a structure, the side surfaces of the end portions of the semiconductor layer 16 are influenced by the atmosphere; however, in cases where the channel portion is distant away from the end portions so as to be free from the influence, the semiconductor layer 16 does not need to be covered wholly.

Embodiment 3

Embodiment 3 of the present invention will be described below with reference to FIG. 9 through FIG. 11.

FIG. 9(a) is a plan view illustrating a thin film transistor 21 according to the present embodiment. Further, FIG. 9(b) is a cross sectional view taken along line E-E of FIG. 9(a). FIG. 9(c) is a cross sectional view taken along line F-F of FIG. 9(a).

As shown in FIG. 9(a) through FIG. 9(c), the thin film transistor 21 serving as a semiconductor device is arranged as follows. That is, a priming insulating layer 23 is formed on an insulating substrate 22. Formed on the priming insulating layer 23 are a source electrode 24 and a drain electrode 25. Further, a semiconductor layer 26 is formed on the priming insulating layer 23, the source electrode 24, and the drain electrode 25. Formed on the semiconductor layer 26 is a first gate insulating layer 27. The semiconductor layer 26 and the first gate insulating layer 27 are covered with a second gate insulating layer 28 which also serves as a protective layer of the semiconductor layer 26. Formed on the second gate insulating layer 28 is a gate electrode 29.

Further, in cases where the thin film transistor 21 is used for a display device such as the active matrix liquid crystal display device of Embodiment 4, the drain electrode 25 is connected to a picture element electrode. Alternatively, the drain electrode 25 is formed in one piece with the picture element electrode, by way of a transparent conductive film.

The priming insulating layer 23 is made of an insulator. Examples of the insulator includes: $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of the insulators.

Alternatively, the priming insulating layer 23 may be made of a resin such as acryl. Such a priming insulating layer 23 made of the resin can be formed with the use of an existing resin formation device. Accordingly, a complex film formation process is not required for the formation of the priming insulating layer 23. This makes it easier to manufacture the thin film transistor 21. This allows reduction of manufacturing cost of the thin film transistor 21. Further, the use of the resin allows improvement of flexibility of the thin film transistor 21. This is especially suitable in cases where a flexible substrate is used as the insulating substrate 22.

The priming insulating layer 23 meeting a region of the bottom surface of the semiconductor layer 26. The region does not meet the source electrode 24 and the drain electrode 25. Further, the priming insulating layer 23 may be made up of a plurality of layers made of the aforementioned insulators. For example, as shown in FIG. 10, the priming insulating layer 23 is made up of two layers: a first priming insulating layer 23a and a second priming insulating layer 23b. In such a structure, the first priming insulating layer 23a is made of an insulator ($SiO_2$) which allows a good interface property with the insulating substrate 22, and the second priming insulating layer 23b is made of an insulator ($Al_2O_3$, AlN, or MgO) which allows a good interface property with the semiconductor layer 26. The priming insulating layer 23 thus obtained on the insulating substrate 22 is highly reliable.

In cases where the insulating substrate 22 is made of glass or quartz, the semiconductor layer 26 is covered with either $SiO_2$ or an insulator containing $SiO_2$ even when no priming insulating layer 23 is provided. This is because glass or quartz contains either $SiO_2$ or such an insulator. Accordingly, the semiconductor layer 16 is blocked from the atmosphere.

The semiconductor layer 26 is made of a semiconductor containing (i) polycrystalline ZnO or polycrystalline $Mg_xZN_{1-x}O$; (ii) amorphous ZnO or amorphous $Mg_xZN_{1-x}O$; or (iii) either mixture of the polycrystalline ZnO and the amorphous ZnO, or mixture of the polycrystalline $Mg_xZN_{1-x}O$ and the amorphous $Mg_xZN_{1-x}O$. A group I element, a group III element, a group IV element, a group V element, or a group VII element is added to the semiconductor. Each of the group I element and the group V element is preferable for the element to be added thereto. For example, the semiconductor layer 26 is made of (i) a semiconductor which contains nitrogen (N), phosphorus (P), arsenic (As), stibium (Sb), or not less than two of these elements, and which contains the polycrystalline ZnO or the polycrystalline $Mg_xZN_{1-x}O$; (ii) a semiconductor which contains nitrogen (N), phosphorus (P), arsenic (As), stibium (Sb), or not less than two of these elements, and which contains the amorphous ZnO or the amorphous $Mg_xZN_{1-x}O$; or (iii) a semiconductor which contains nitrogen (N), phosphorus (P), arsenic (As), stibium (Sb), or not less than two of these elements, and which contains either (a) the mixture of the polycrystalline ZnO and the amorphous ZnO, or (b) the mixture of the polycrystalline $Mg_xZN_{1-x}O$ and the amorphous $Mg_xZN_{1-x}O$.

The first gate insulating layer 27 meets the semiconductor layer 26, and is made of an insulator. Examples of the insulator includes: $SiO_2$, $Al_{2O3}$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of the insulators. Further, the gate insulating layer 27 may be made up of a plurality of layers made of the above insulators. For example, the gate insulating layer 27 may be made up of a first insulating layer 27a and a second insulating layer 27b as shown in FIG. 10. In such a structure, the first insulating layer 27a is made of an insulator having a good interface property with the semiconductor layer 26, such as $Al_2O_3$, AlN, and MgO. On the other hand, the second insulating layer 27b is made of an insulator having a good insulation performance, such as $SiO_2$. The gate insulating layer 27 thus obtained between the semiconductor layer 26 and the gate electrode 28 is highly reliable.

The second gate insulating layer 28 is so formed as to cover the semiconductor layer 26 and the first gate insulating layer 27, which are formed on top of each other. The second gate insulating layer 28 is made of an insulator. Examples of the insulator include: $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and a mixed crystal of $LiGaO_2$ such as $(Li_{1-(x+y)}Na_xK_y)(Ga_{1-z}Al_z)O_2$. Another example thereof is a solid solution containing at least two of them.

Alternatively, the second gate insulating layer 28 may be made of a resin such as acryl, as is the case with the priming insulating layer 23. This renders the same benefit as the benefit rendered when the priming insulating layer 23 is made of resin.

The second gate insulating layer 28 has sidewalls covering the side surfaces, which are surfaces excluding (i) the bottom surface of the semiconductor layer 26, and (ii) the upper surface of the semiconductor layer 26. The bottom surface of the semiconductor layer refers to the surface meeting the priming insulating layer 23, the source electrode 24, and the drain electrode 25. The upper surface thereof refers to the surface meeting the first gate insulating layer 27. As such, the second gate insulating layer 28 provided under the gate electrode 29 serves as a protective layer covering the side surface of the semiconductor layer 26. Further, the second gate insulating layer 28 is provided such that the first gate insulating layer 27 and the second gate insulating layer 28 constitute a gate insulating layer securely having a thickness significant for a gate insulating layer.

Further, the second gate insulating layer 28 may be made up of a plurality of layers of the aforementioned insulators. For example, as shown in FIG. 10, the second gate insulating layer 28 is made up of two layers: a lower insulating layer 28a and an upper insulating layer 28b. In such a structure, the first insulating layer 28a is made of an insulator having a good interface property with the semiconductor layer 26, such as $Al_2O_3$, AlN, and MgO. On the other hand, the second insulating layer 28b is made of an insulator blocking the semiconductor layer 26 from the atmosphere well, such as $SiO_2$. The second gate insulating layer 28 thus obtained between the first gate insulating layer 27 and the gate electrode 29 is highly reliable.

In the thin film transistor 21, the priming insulating layer 23, the source electrode 24, the drain electrode 25, the first gate insulating layer 27, and the second gate insulating layer 29 forms a blocking member, i.e., respectively serve as blocking layers.

Explained here is a method for manufacturing the thin film transistor 21 arranged as above, with reference to FIG. 11(a) through FIG. 11(d) respectively illustrating processes of the manufacturing thereof.

Firstly, for example, $Al_2O_3$ is provided on the insulating substrate 22 as the priming insulating layer 23 in accordance with the pulse laser deposition method so as to have a thickness of approximately 100 nm (see FIG. 11(a)). The deposition is carried out in the following conditions (1) through (4): (1) the substrate temperature is set at 300° C., (2) the film forming is carried out under vacuum oxygen atmosphere, (3) the laser power is set at 3.0 J/cm$^2$, and (4) the repetition frequency is set at 10 Hz. Note that the material of the priming insulating layer 23 is $Al_2O_3$ here; however, each of the aforementioned insulators may be used for the material.

Next, Al is so provided on the priming insulating layer 23 as to have a thickness of approximately 150 nm, in accordance with the sputtering method or the like. Then, dry etching is carried out with the use of a resist patterned in a predetermined shape in accordance with photolithography, with the result that an irrelevant part of the Al layer is removed. This allows formation of the source electrode 24 and the drain electrode 25 (see FIG. 11(b)).

Next, the following is carried out for the purpose of forming the semiconductor layer 26. For example, polycrystalline ZnO to which nitrogen is doped is so provided in accordance with the pulse laser deposition method as to have a thickness of approximately 50 nm. The deposition is carried out in the following conditions (1) through (4): (1) the substrate temperature is set at 300° C., (2) the film forming is carried out under a mixture atmosphere of vacuum oxygen and nitrogen monoxide, (3) the laser power is set at 1.1 J/cm$^2$, and (4) the repetition frequency is set at 10 Hz (see FIG. 3(b)). With this method, a layer of ZnO to which nitrogen is doped is formed. Note that nitrogen monoxide is used as a nitrogen source here; however, a gas including nitrogen such as dinitrogen monoxide, nitrogen dioxide, and ammonia may be used for the nitrogen source. Note also that N is used here as the impurity to be doped to ZnO; however, P, As, or Sb may be used as the impurity. Note also that the material of the semiconductor layer 26 is ZnO here; however, ZnO ($Mg_xZn_{1-x}O$) containing Mg may be used as the material. Further, the ZnO and the ZnO containing Mg may be amorphous, polycrystalline, or amorphous and polycrystalline.

Formed continuously after the deposition of the semiconductor layer 26 is the first gate insulating layer 27. The first gate insulating layer 27 is formed, e.g., as follows. That is, $Al_2O_3$ is so provided in accordance with the pulse laser deposition method as to have a thickness of approximately 50 nm. The formation of the $Al_2O_3$ thin film is carried out in the following conditions (1) through (4): (1) the substrate temperature is set at 300° C., (2) the film forming is carried out under vacuum oxygen atmosphere, (3) the laser power is set at 3.0 J/cm$^2$, and (4) the repetition frequency is set at 10 Hz. Note that $Al_2O_3$ is used as the material of the first gate insulating layer 27; however, the aforementioned insulators may be used instead. Further, the first gate insulating film 27 may be made up of a plurality of layers made of the aforementioned insulators.

Thereafter, ion milling is carried out with the use of a resist patterned in a predetermined shape in accordance with photolithography, with the result that respective irrelevant parts of the ZnO layer and the $Al_2O_3$ layer is removed. With this, the first gate insulating layer 27 and the semiconductor layer 26 are formed (see FIG. 11(c)). Here, the respective side surfaces of the first gate layer 27 and the semiconductor layer 26 are perpendicular to the upper surface of the insulating substrate 22. However, for attainment of a good coverage by the second gate insulating layer 28, the side surfaces may form a forward tapered shape expanding from the first gate insulating film 27 toward the semiconductor layer 26.

Next, the second gate insulating film 28 is formed, e.g., as follows. That is, $Al_2O_3$ is so provided in accordance with the pulse laser deposition method as to have a thickness of approximately 450 nm. The film forming is carried out in the following conditions (1) through (4): (1) the substrate temperature is set at 300° C., (2) the film forming is carried out under vacuum oxygen atmosphere, (3) the laser power is set at 3.0 J/cm$^2$, and (4) the repetition frequency is set at 10 Hz. Note that $Al_2O_3$ is used as the material of the second gate insulating layer 28; however, the aforementioned insulators may be used instead. Further, the second gate insulating film 28 may be made up of a plurality of layers made of the aforementioned insulators.

Thereafter, for the purpose of forming the gate electrode 29, Al or the like is so provided in accordance with the sputtering method as to have a thickness of 200 nm. Carried out next is ion milling with the use of a resist patterned in a predetermined shape in accordance with the photolithography, with the result that respective irrelevant parts of the gate electrode 29 and the second gate insulating film 28 are removed. With this, the manufacturing of the thin film transistor 21 is completed (see FIG. 11(d)).

The thin film transistor 11 thus obtained has the same $I_d$-$V_g$ property as the property shown in FIG. 4. That is, the threshold voltage $V_{th}$ of the thin film transistor 21 is so controlled as to be on the order of 0 V. As such, the threshold voltage $V_{th}$ is so controlled as to be a voltage causing practically no problem, by forming the semiconductor layer 26 with the use of the semiconductor obtained by doping nitrogen into ZnO.

Further, as described in Embodiment 1, doping of the other group V element such as P, AS, or Sb makes it possible to control, in the same manner, the threshold voltage $V_{th}$ to be on the order of 0 V.

Further, the threshold voltage $V_{th}$ can be controlled in the same manner when doping a group I element, a group III element, a group IV element, or a group VII element into a semiconductor containing (i) the polycrystalline ZnO or the polycrystalline $Mg_xZN_{1-x}O$; (ii) the amorphous ZnO or the amorphous $Mg_xZN_{1-x}O$; or (iii) either the mixture of the polycrystalline ZnO and the amorphous ZnO, or the mixture of the polycrystalline $Mg_xZN_{1-x}O$ and the amorphous $Mg_xZN_{1-x}O$.

Note that the semiconductor layer 26 is wholly covered with the priming insulating layer 23, the source electrode 24, the drain electrode 25, the first gate insulating film 27, and the second gate insulating film 28 in the structure shown in FIG. 9(a) through FIG. 9(c); however, the semiconductor layer 26 does not need to be wholly covered as long as a channel portion (a region in which a carrier moves) of the semiconductor layer 26 of the thin film transistor 21 is not influenced by the atmosphere. For example, see chain-double dashed line in FIG. 9(a), illustrating a structure in which: the semiconductor layer 26 and the first gate insulating layer 27 extend in the direction of the channel width, and respectively have end portions which are not covered with the second gate insulating layer 28 and which are exposed to the atmosphere. In such a structure, the side surfaces of the end portions of the semiconductor layer 26 are influenced by the atmosphere; however, in cases where the channel portion is distant away from the end portions so as to be free from the influence, the semiconductor layer 26 does not need to be covered wholly.

Embodiment 4

Embodiment 4 of the present invention will be described below with reference to FIG. 1, FIG. 2, FIG. 3, FIG. 5, FIG. 6, FIG. 7, FIG. 9, FIG. 10, FIG. 17, and FIG. 18. Note that, materials having the equivalent functions as those of the materials of Embodiments 1 through 3 will be given the same reference symbols, and explanation thereof will be omitted here.

See FIG. 1(a) through FIG. 1(c). The semiconductor layer 5 of the thin film transistor 1 is replaced with a semiconductor layer 105. The semiconductor layer 105 serves as an active layer, and is made of a semiconductor as is the case with the semiconductor layer 5. Specifically, the semiconductor layer 105 is made of a semiconductor containing (i) polycrystalline ZnO or polycrystalline $Mg_xZN_{1-x}O$; (ii) amorphous ZnO or amorphous $Mg_xZN_{1-x}O$; or (iii) either mixture of the polycrystalline ZnO and the amorphous ZnO, or mixture of the polycrystalline $Mg_xZN_{1-x}O$ and the amorphous $Mg_xZN_{1-x}O$. A group I element, a group III element, a group IV element, a group V element, or a group VII element is added to the semiconductor. Each of the group I element and the group V element is preferable for the element to be added thereto. For example, the semiconductor layer 105 is made of (i) a semiconductor which contains hydrogen, and which contains nitrogen (N), phosphorus (P), arsenic (As), stibium (Sb), or not less than two of these elements, and which contains the polycrystalline ZnO or the polycrystalline $Mg_xZN_{1-x}O$; (ii) a semiconductor which contains hydrogen, and which contains nitrogen (N), phosphorus (P), arsenic (As), stibium (Sb), or not less than two of these elements, and which contains the amorphous ZnO or the amorphous $Mg_xZN_{1-x}O$; or (iii) a semiconductor which contains hydrogen, and which contains nitrogen (N), phosphorus (P), arsenic (As), stibium (Sb), or not less than two of these elements, and which contains either (a) the mixture of the polycrystalline ZnO and the amorphous ZnO, or (b) the mixture of the polycrystalline $Mg_xZN_{1-x}O$ and the amorphous $Mg_xZN$-x O.

In the manufacturing of the thin film transistor 1 thus arranged, the semiconductor layer 105 is manufactured in accordance with a manufacturing process different from that of the semiconductor layer 5 as described below. For example, for the purpose of forming the semiconductor layer 105 continuously after the $Al_2O_3$ deposition for forming the gate insulating layer 4 as shown in FIG. 3(b), polycrystalline ZnO to which nitrogen and hydrogen are doped is so provided in accordance with the pulse laser deposition method as to have a thickness of approximately 50 nm. The deposition is carried out in the following conditions (1) through (4): (1) the substrate temperature is set at 200° C.; (2) the film forming is carried out under mixture atmosphere of nitrogen gas and water vapor; (3) the laser power is set at 1.1 J/cm2, and (4) the repetition frequency is set at 10 Hz. With this method, a layer of ZnO to which nitrogen and hydrogen is doped is formed.

The nitrogen gas is used as a nitrogen source here; however, a gas including nitrogen such as dinitrogen monoxide, nitrogen dioxide, and ammonia may be used for the nitrogen source. Moreover, the water vapor is used as a hydrogen source; however, a gas including hydrogen such as hydrogen peroxide may be used as the hydrogen source. Further, a gas containing nitrogen and hydrogen may be used. A specific example of such a gas is an ammonia gas. In cases where such a gas is used, the nitrogen source is not required. Alternatively, a plurality of gases may be used, as the hydrogen source, from among the water vapor, the hydrogen peroxide gas, and the ammonia gas. Further, the explanation here assumes the case where the material of the semiconductor layer 105 is ZnO; however, ZnO ($Mg_xZn_{1-x}O$) containing Mg may be used for the material. Further, the ZnO and the ZnO containing Mg may be amorphous, polycrystalline, or amorphous and polycrystalline.

Figure 17:
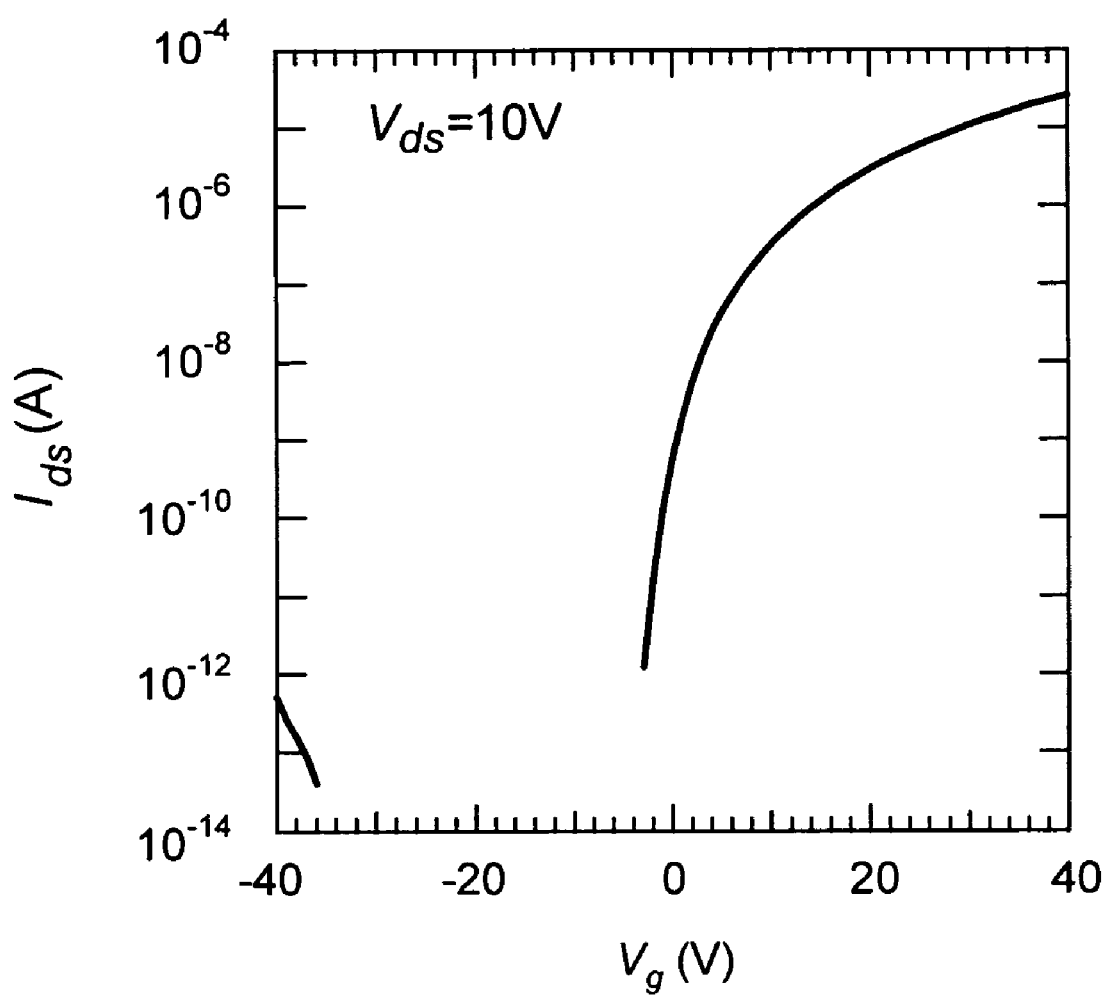
FIG. 17 is a diagram illustrating the $I_d$-$V_g$ property of a thin film transistor according to Embodiment 4.

FIG. 17 illustrates the $I_d$-$V_g$ property of the thin film transistor 1 thus obtained. Compare the $I_d$-$V_g$ property shown in FIG. 17 with the $I_d$-$V_g$ property (see FIG. 15) of the thin film transistor which has the protective layer and which uses ZnO to which no nitrogen and no hydrogen are doped. The comparison clarifies that the thin film transistor 1 has a threshold voltage $V_{th}$ of on the order of 0 V. As such, the doping of nitrogen and hydrogen into ZnO makes it possible that the threshold voltage $V_{th}$ of the thin film transistor 1 having the protective layer 8 is so controlled as to be a voltage practically causing no problem.

It is understood why the threshold voltage $V_{th}$ is controlled by doping nitrogen and hydrogen into ZnO, as follows. That is, the formation of the protective layer causes elimination of a surface depletion layer. Accordingly, too many free electrons are generated. Nitrogen is a group V element, so that nitrogen works as an acceptor impurity. Therefore, the doping of nitrogen allows reduction of such too many free electrons. Hydrogen is a group I element, so that hydrogen works as a terminator with respect to dangling bond attributing to the generation of the free electrons. Therefore, the doping of hydrogen also allows reduction of such too many free electrons. Further, the doping of nitrogen and hydrogen causes decrease of the fermi level to the center of the band-gap. This allows decrease of the gate voltage required for removal of the too many free electrons, with the result that the threshold voltage becomes on the order of 0 V.

Figure 18:
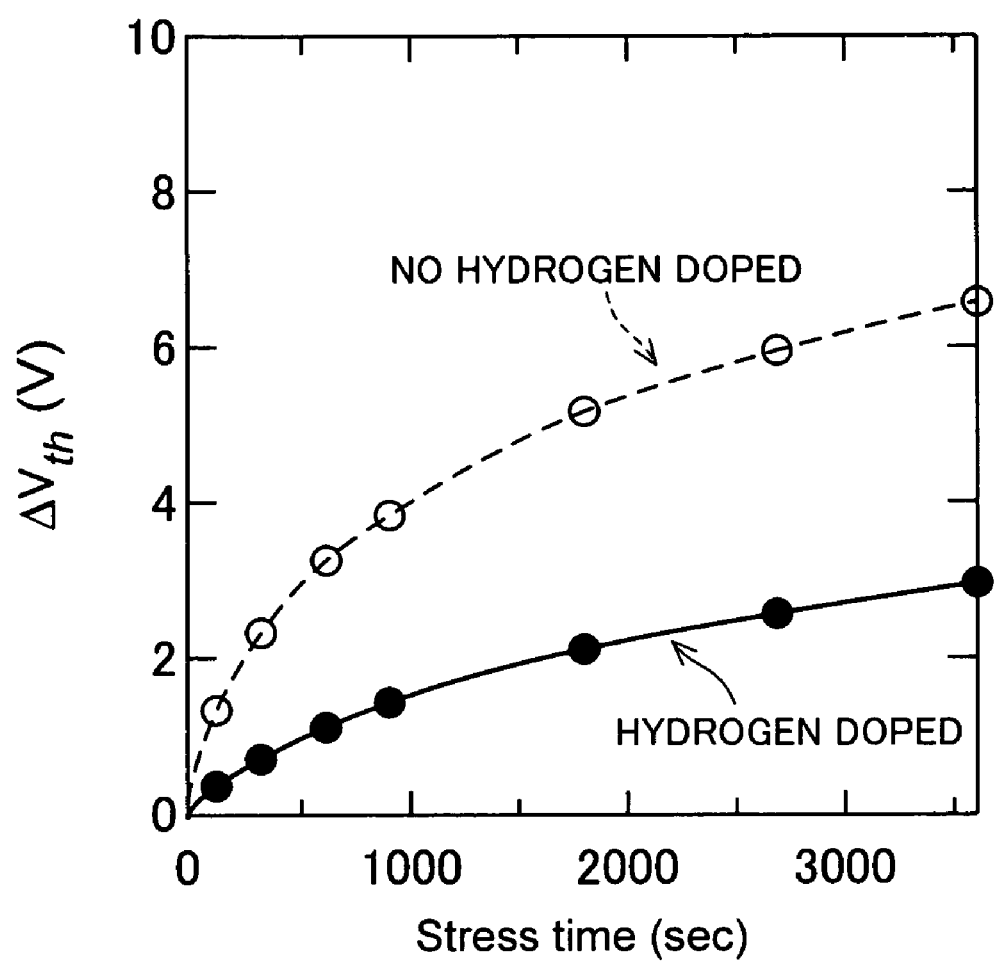
FIG. 18 is a diagram illustrating a TFT property change occurring over time in response to application of a positive gate voltage, in the thin film transistor according to Embodiment 4.

Further, the doping of hydrogen allows restraint of a TFT property change (threshold voltage positive shift ΔVth) occurring over time in response to application of a positive gate voltage, as shown in FIG. 18. Specifically, see the following observation of the threshold voltage change occurring over time under such a condition that the source electrode and the drain electrode each had a ground potential, and that a voltage of +30 V was applied to the gate electrode. The observation clarifies that the TFT formed under the $H_2O+N_2$ atmosphere allows restraint of the threshold voltage shift amount as compared with the TFT formed under the $O_2+NO$ atmosphere.

This is also true when another group V element such as P, As, or Sb is used. Specifically, see an example in which a Zn compound containing a group V element such as $Zn_2P_3$, $Zn_2As_3$, or $Zn_2Sb_3$ is used as a target for the doping, and in which the semiconductor layer 105 is formed under the following conditions (1) through (3): (1) the substrate temperature is set at 200° C., (2) the film forming is carried out under vacuum water vapor atmosphere, and (3) the laser power is set at 1.1 J/cm². With this, the threshold voltage $V_{th}$ can be also so controlled as to be on the order of 0V. Of course, the threshold voltage $V_{th}$ can be controlled in the same manner in accordance with the above method when $Zn_2N_3$ is used as the target for the doping.

Figure 7:
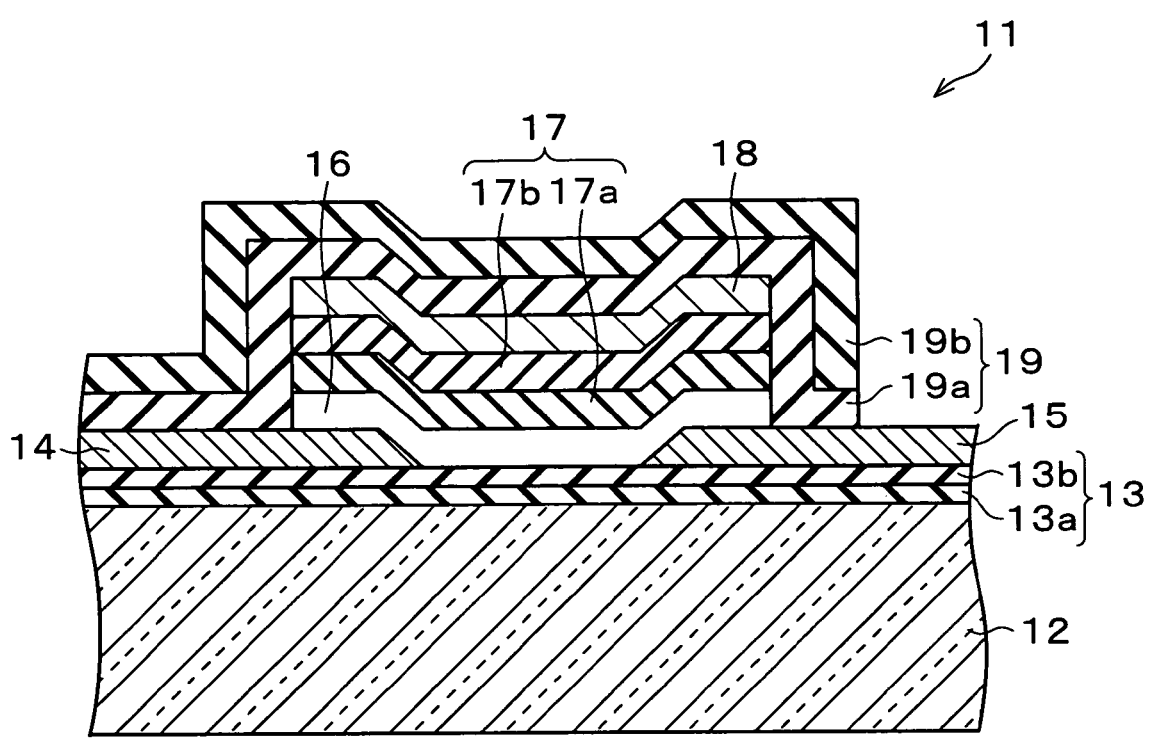
FIG. 7 is a cross section illustrating another structure of the thin film transistor according to Embodiment 2.
Figure 8:
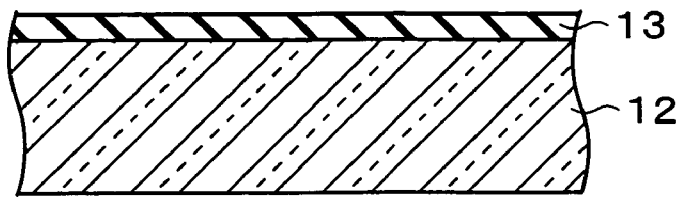
FIG. 8(a) is a cross sectional view illustrating a priming insulating layer formation process in manufacturing the thin film transistor shown in FIG. 6.
FIG. 8(b) is a cross sectional view illustrating a process of forming a source electrode and a drain electrode, in manufacturing the thin film transistor shown in FIG. 6.
FIG. 8(c) is a cross sectional view illustrating a process of forming a semiconductor layer, a gate insulating film, and a gate electrode, in manufacturing the thin film transistor shown in FIG. 6.
FIG. 8(d) is a cross sectional view illustrating a final process in manufacturing the thin film transistor shown in FIG. 6.
Figure 8:
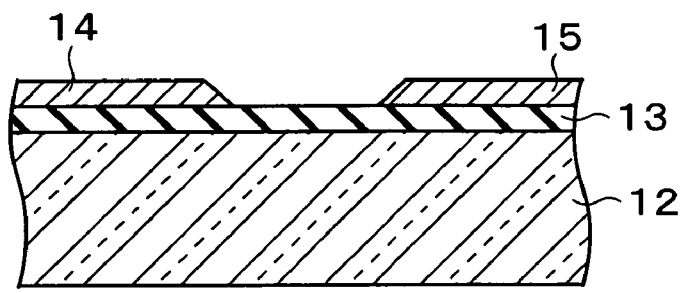
Figure 8:
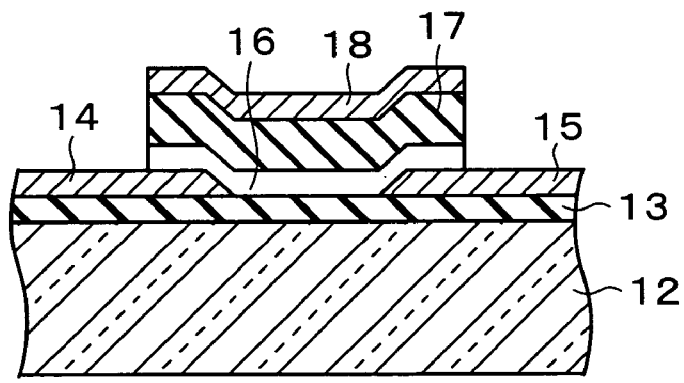
Figure 8:
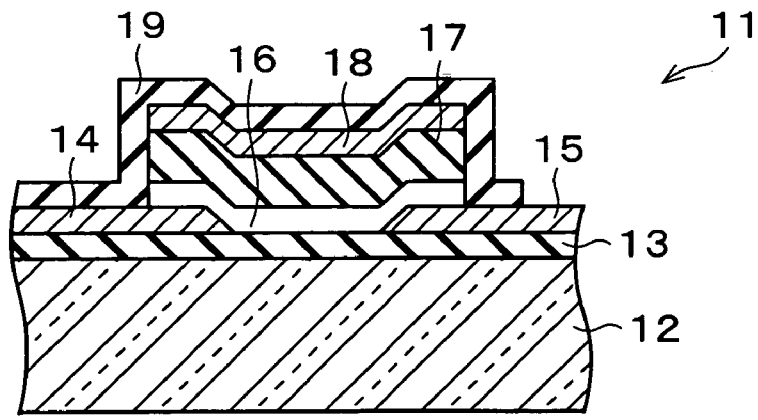
Figure 9:
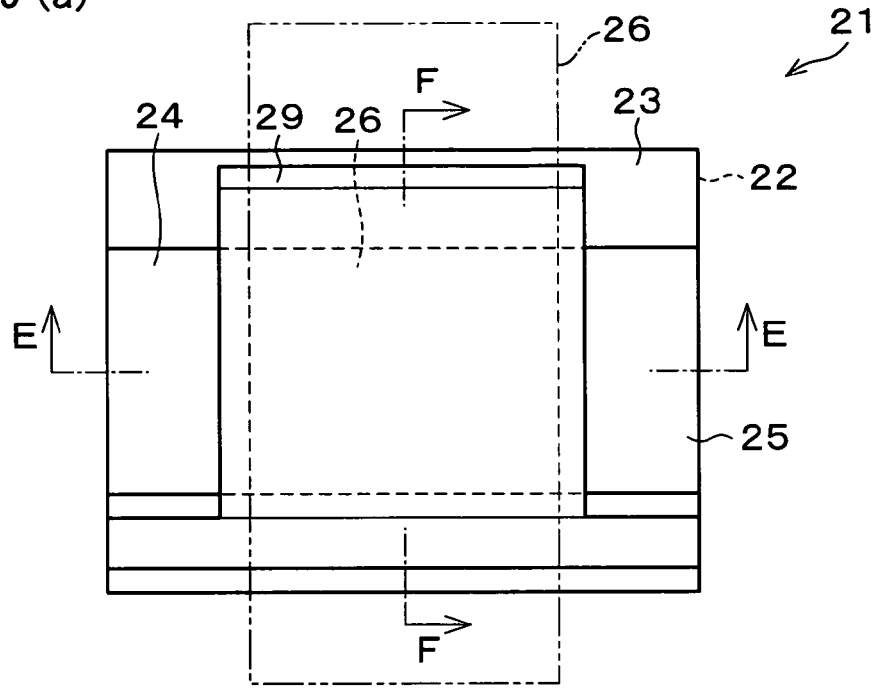
FIG. 9(a) is plan view illustrating a structure of a thin film transistor according to Embodiment 3.
FIG. 9(b) is a cross sectional view taken along line E-E shown in FIG. 9(a).
FIG. 9(c) is a cross sectional view taken along line F-F shown in FIG. 9(a).
Figure 9:
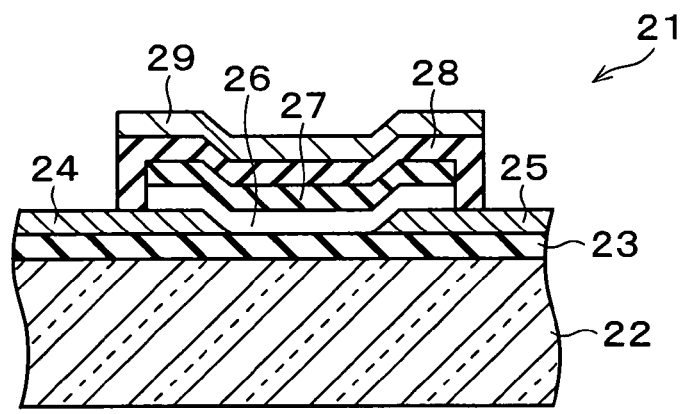
Figure 9:
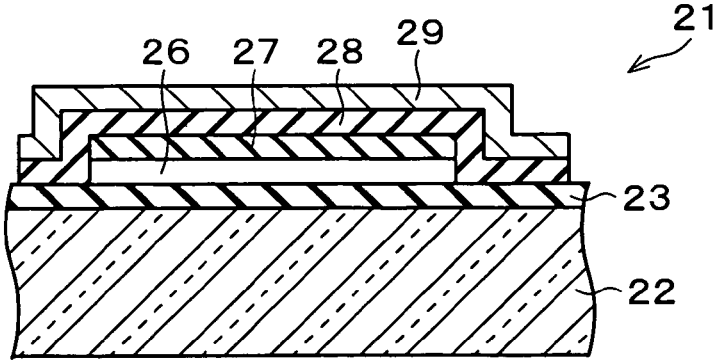
Figure 10:
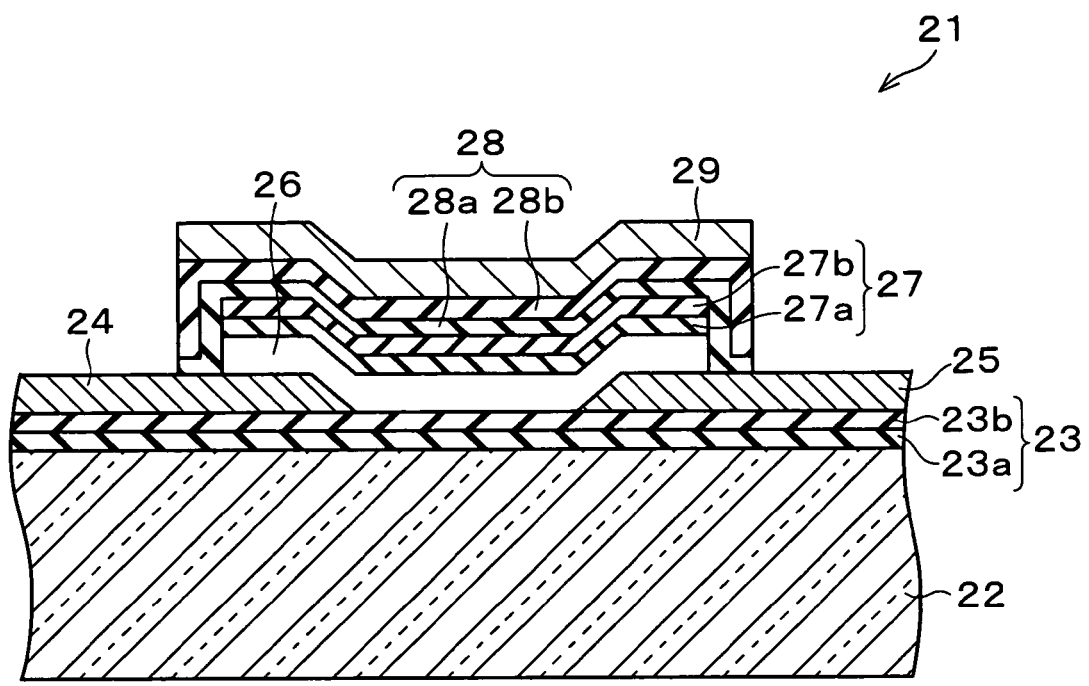
FIG. 10 is a cross sectional view illustrating another structure of the thin film transistor according to Embodiment 3.
Figure 11:
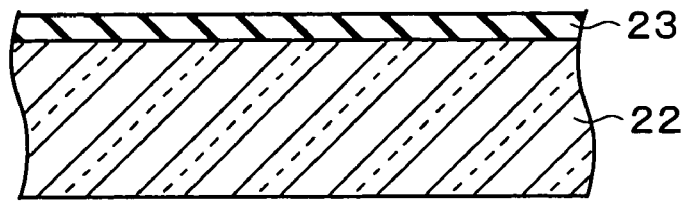
FIG. 11(a) is a cross sectional view illustrating a prime insulating film forming process in manufacturing of the thin film transistor shown in FIG. 9(a).
FIG. 11(b) is a cross sectional view illustrating a process of forming a source electrode and a drain electrode in the manufacturing of the thin film transistor shown in FIG. 9(a).
FIG. 11(c) is a cross sectional view illustrating a process of forming a first gate insulating layer and a semiconductor layer in the manufacturing of the thin film transistor shown in FIG. 9(a).
FIG. 11(d) is a cross sectional view illustrating a final process in the manufacturing of the thin film transistor shown in FIG. 9(a).
Figure 11:
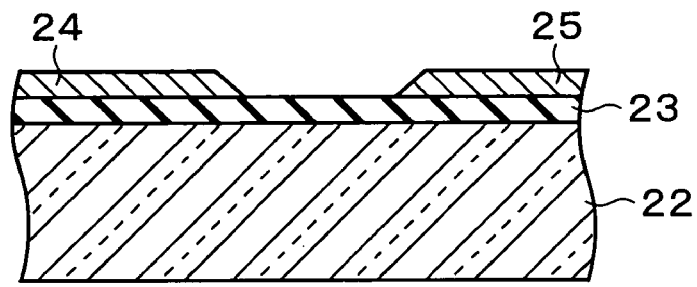
Figure 11:
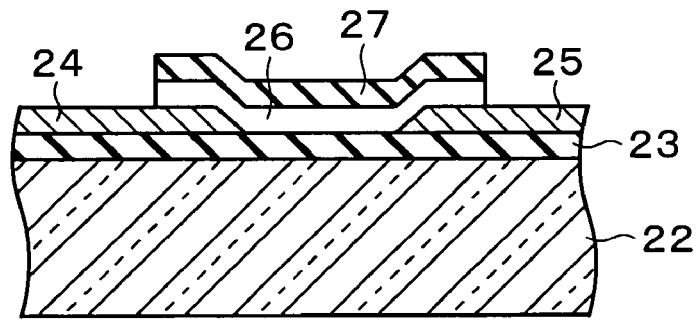
Figure 11:
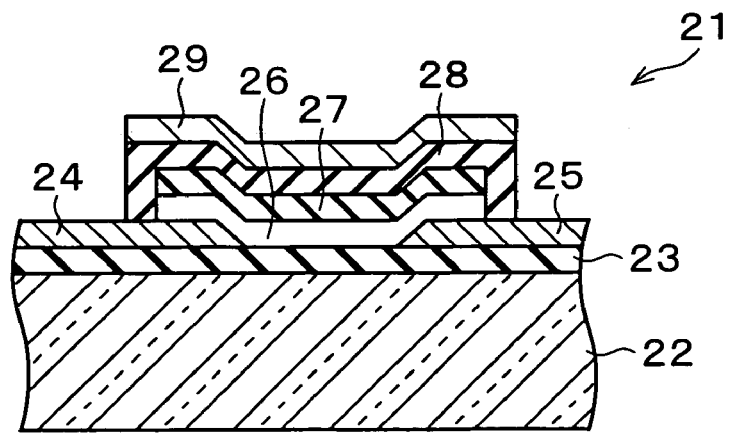

Such an effect can be also rendered in cases where each of the semiconductor layer 5 shown in FIG. 5, the semiconductor layer 16 of the thin film transistor 11 shown in FIG. 6, the semiconductor layer 16 shown in FIG. 7, the semiconductor layer 26 of the thin film transistor 21 shown in FIG. 9, and the semiconductor layer 26 shown in FIG. 10 is made of a semiconductor containing (i) the polycrystalline ZnO or the polycrystalline $Mg_xZN_{1-x}O$; (ii) the amorphous ZnO or the amorphous $Mg_xZN_{1-x}O$; or (iii) either the mixture of the polycrystalline ZnO and the amorphous ZnO, or the mixture of the polycrystalline $Mg_xZN_{1-x}O$ and the amorphous $Mg_xZN_{1-x}O$. The semiconductor contains (i) hydrogen, and (ii) nitrogen (N), phosphorus (P), arsenic (As), stibium (Sb), or not less than two of these elements. With this, the threshold voltage $V_{th}$ can be so controlled as to be on the order of 0 V.

Embodiment 5

Embodiment 5 of the present invention will be described below with reference to FIG. 12 and FIG. 13. Note that, materials having the equivalent functions as those of the materials of Embodiments 1 through 4 will be given the same reference symbols, and explanation thereof will be omitted here.

Figure 12:
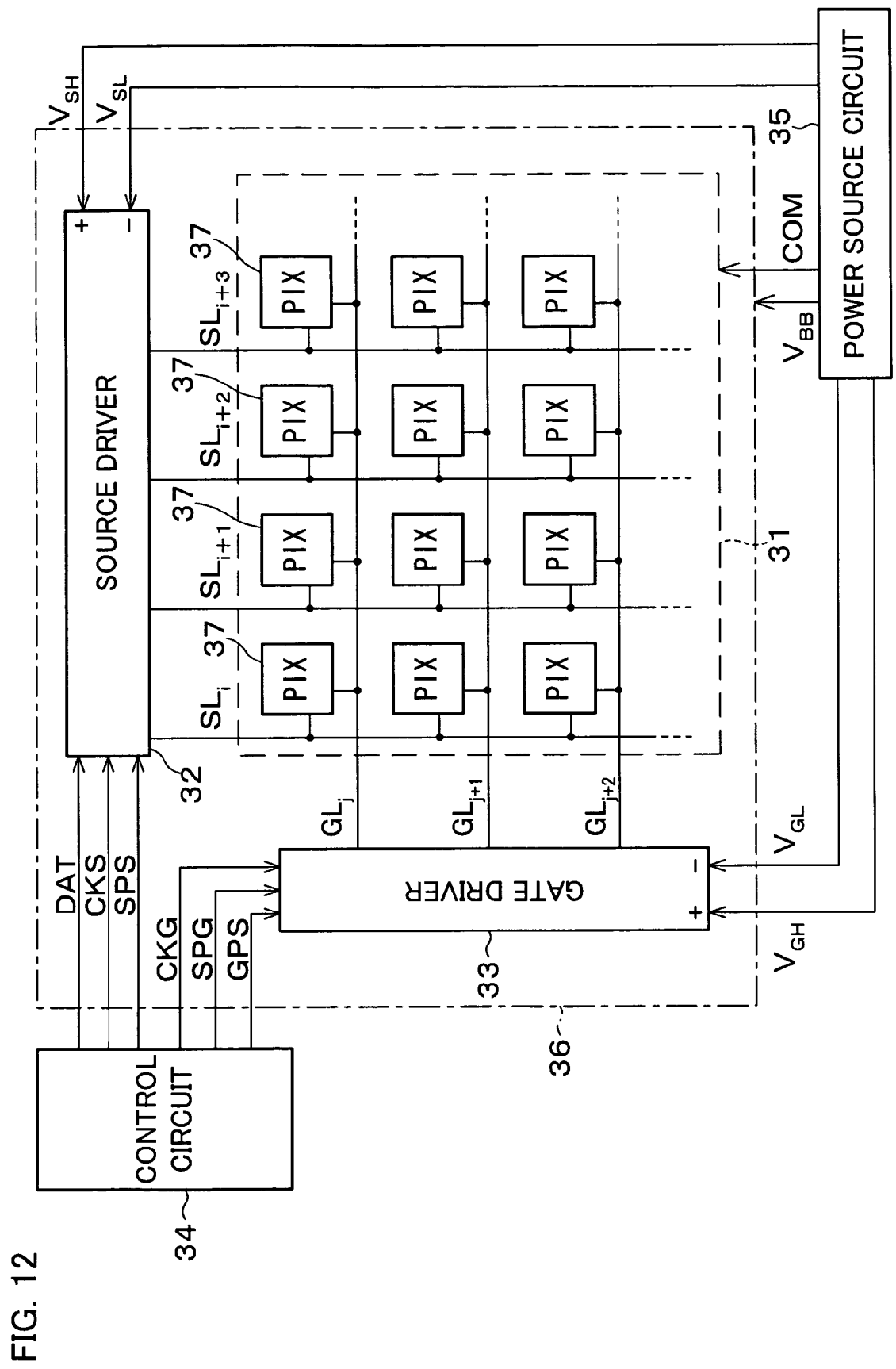
FIG. 12 is a block diagram schematically illustrating a structure of an active matrix type liquid crystal display device according to Embodiment 5 of the present invention.

As shown in FIG. 12, a display device according to the present embodiment is an active matrix type liquid crystal display device, and includes a picture element array 31, a source driver 32, a gate driver 33, a control circuit 34, and a power source circuit 35.

The picture element array 31, the source driver 32, and the gate driver 33 are provided on a substrate 36. The substrate 36 is made of an insulative and translucent material such as glass. The picture element array 31 includes source lines SL, gate lines GL, and picture elements 37.

Specifically, in the picture element array 31, a large number of gate lines $GL_j$, $GL_{j+1}$, . . . , are so provided as to cross with a large number of source lines $SL_i$, $SL_{i+1}$, . . . . Each of the picture elements 37 indicated as "PIX" in FIG. 12 is provided in a portion surrounded by two adjacent gate lines GL and two adjacent source lines SL. As such, the picture elements 37 are formed in a matrix manner in the picture element array 31. One source line SL is provided for each row of the picture elements 37, whereas one gate line GL is provided for each column of the picture elements 37.

Figure 13:
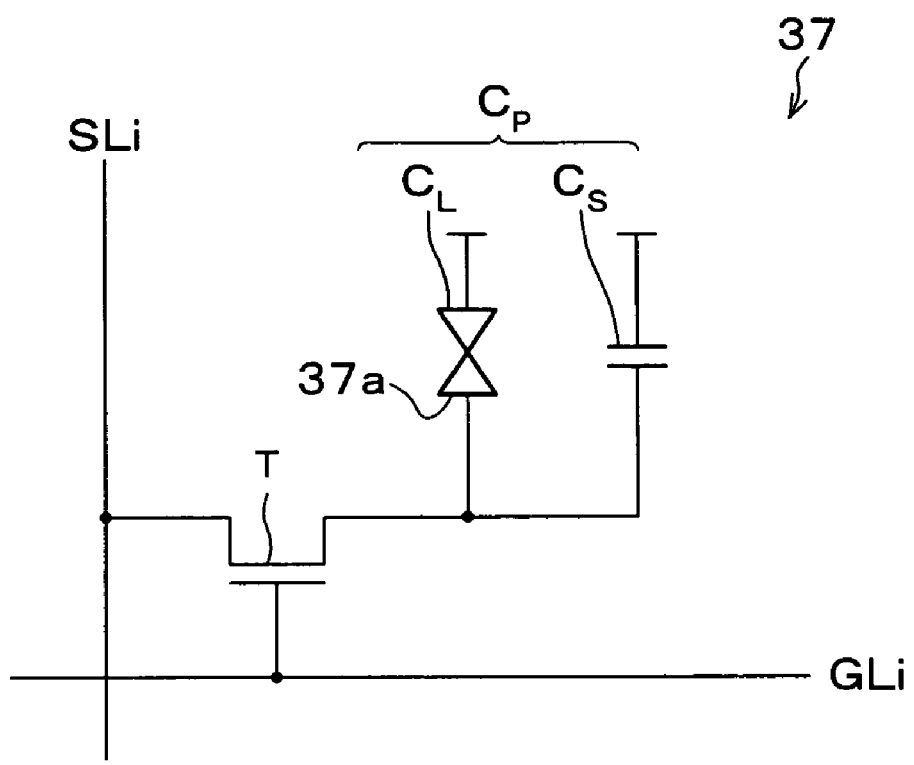
FIG. 13 is a circuit diagram illustrating a structure of a picture element of the liquid crystal display device shown in FIG. 12.
Figure 14:
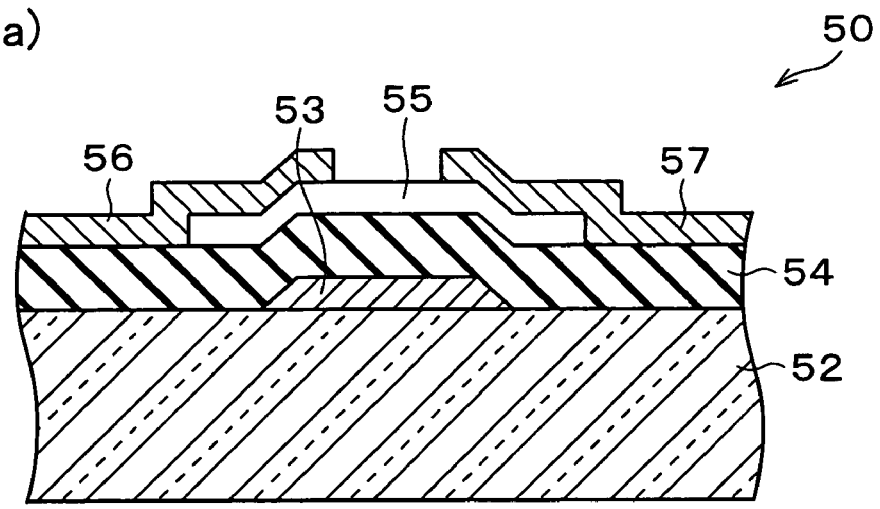
FIG. 14(a) is a cross sectional view illustrating a structure of a thin film transistor having no conventional protective layer.
FIG. 14(b) is a cross sectional view illustrating a structure of a thin film transistor having the conventional protective layer.
Figure 14:
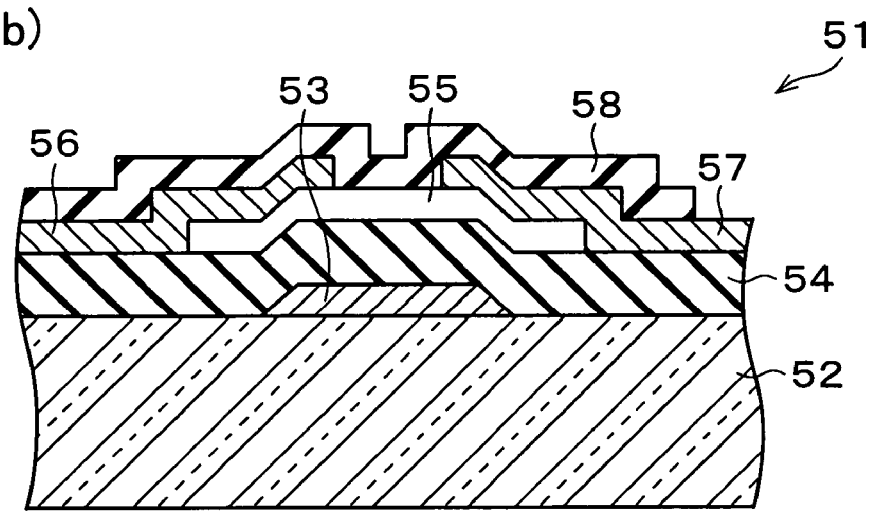

As shown in FIG. 13, each of the picture elements 37 provided in such a liquid crystal display is made up of a transistor T serving as a switching element, and a picture element capacitor $C_p$ having a liquid crystal capacitor $C_L$. Generally, for attainment of a stable display operation, the picture element capacitor $C_p$ in the active matrix type liquid crystal display includes an auxiliary capacitor $C_s$ provided in parallel with the liquid crystal capacitor $C_L$. The auxiliary capacitor $C_s$ is necessary for restraint of respective influences of (i) respective leakage currents of the liquid crystal capacitor $C_L$ and the transistor 7, (ii) a gate-source capacitance of the transistor T, (iii) a picture element potential change caused by a parasite capacitance such as a picture element electrode-signal line capacitance, (iv) display data dependency of the liquid crystal capacitor $C_L$, and the like. With this, the influences are restrained to the minimum.

The transistor T has a gate connected to the gate line $GL_j$. Further, each of the liquid crystal capacitor $C_L$ and the auxiliary capacitor $C_s$ has an electrode connected to the source line $SL_j$ via the drain of the transistor T and the source thereof. The electrode, which is connected to the drain, of the liquid crystal capacitor $C_L$ serves as a picture element electrode 37a. The other electrode of the liquid crystal capacitor $C_L$ is connected to a counter electrode with a liquid crystal cell therebetween. Further, the other electrode of the auxiliary capacitor $C_s$ is connected to a common electrode line (not shown) which is shared by all the picture elements, in cases where the display device adopts the Cs-on-Common structure. In cases where the display device adopts the Cs-on-Gate structure, the other electrode of the auxiliary capacitor $C_s$ is connected to an adjacent gate line GL.

The gate lines $GL_j$, $GL_{j+1}$, . . . are connected to the gate driver 33, and the data signal lines $SL_i$, $SL_{i+1}$, . . . are connected to the source driver 32. The gate driver 33 is driven by different power source voltages $V_{GH}$ and $V_{GL}$, and the source driver 32 is driven by different power source voltages $V_{SH}$ and $V_{SL}$.

The source driver 32 samples an image signal DAT supplied from the control circuit 34. The sampling is carried out in accordance with a sync signal CKS and a start pulse SPS. Thereafter, the source driver 32 sends the sampled image signal DAT to the source lines $SL_i$, $SL_{i+1}$, . . . which are respectively connected to the rows of the pixels. The gate driver 33 generates a gate signal in accordance with sync signals CKG and GPS, and a start pulse SPG, each of which is supplied from the control circuit 34. The gate signal thus generated is supplied to the gate lines $GL_j$, $GL_{j+1}$, . . . which are respectively connected to the columns of the picture elements 37.

The power source circuit 35 is a circuit for generating (i) the power source voltages $V_{SH}$, $V_{SL}$, $V_{GH}$, and $V_{GL}$; (ii) a ground potential COM; and (iii) a voltage $V_{BB}$. The power source voltages $V_{SH}$ and $V_{SL}$ are voltages whose levels are different, and are supplied to the gate driver 33. The power source voltage $V_{GH}$ and $V_{GL}$ are voltages whose levels are different, and are supplied to the gate driver 33. The ground potential COM is supplied to the common electrode line (not shown) which is provided in the substrate 36.

When the transistor T becomes ON in response to receipt of the gate signal from the gate driver 33 via the gate line $GL_j$, the image signal supplied from the source driver 32 via the source line $SL_{i+1}$ is written in the picture element 37 (picture element electrode 37a). The transistor T corresponds to each of (i) the thin film transistor 1 shown in FIG. 1(a) and described in Embodiments 1 and 4; (ii) the thin film transistor 11 shown in FIG. 6(a) and described in Embodiment 2; and (iii) the thin film transistor 21 shown in FIG. 9(a) and described in Embodiment 3. Each of the thin film transistors 1, 11, and 21 makes it possible that the threshold voltage $V_{th}$ is so controlled as to be a voltage practically causing no problem, as described above. An appropriate threshold voltage of the liquid crystal display device arranged as above falls within a range from approximately 0V to approximately 3V. Therefore, in cases where the thin film transistor is applied to such a liquid crystal display device, the threshold voltage can be set appropriately by controlling the doping amount. Therefore, each of the thin film transistors 1, 11, and 21 can be used for the transistor T for driving the picture element 37. This causes practically no problem.

Further, each of the thin film transistors 1, 11, and 21 can be used for a transistor of a transistor circuit of circuit elements constituting the source driver 32 and the gate driver 33. This causes practically no problem.

Further, when the transistors 1, 11, and 21 are used for the transistor T of the picture element 37 and the transistor of each of the driving circuits, these transistors can be simultaneously manufactured on the substrate 36 in accordance with the same process. This allows reduction of manufacturing processes of the matrix display device. Accordingly, the cost of the matrix display device is reduced.

As described above, the threshold voltage is appropriately controlled by using each of the thin film transistors 1, 11, and 21 for the transistor T of the picture element and the transistor of the driving circuits. This makes it possible to provide a matrix display device operating stably.

In the above description, the present embodiment and the other embodiments provide the examples; however, the present invention is not limited to the embodiments above, and is applied to any structure formed based on a similar idea.

For example, Embodiments 1 through 4 exemplify the transistors 1, 11, and 21. However, the present invention is applicable to a pn connection diode, a Schottky diode, a bipolar transistor, a Shottky barrier electric field effect transistor, a connection type electric field effect transistor, and the like as long as each of the diodes and transistors has a structure in which: an active layer is made of ZNO or $Mg_xZN_{1-x}O$, and a protective layer is provided, and nitrogen or the like is doped to the ZnO in the same manner.

Further, Embodiment 5 exemplifies the active matrix type liquid crystal display device serving as an electronic device; however, the present invention is applicable to another display device as long as each of the thin film transistors 1, 11, and 21 is used as a switching element. Examples of the display device include: an organic EL display device, and a flexible display device.

Further, the present invention is applicable to an electronic device other than the display device. Examples of such an electronic device include: a line type image scanner, a matrix type image scanner, an X-ray image sensor, and the like, in each of which each of the thin film transistors 1, 11, and 21 is used as a switching element. In such scanner and sensor, the switching element is connected between a picture element electrode and a source line for the purpose of discharging electric charges accumulated in an electric charge accumulation capacitor, and becomes ON upon receipt of a gate voltage (scanning signal) supplied via the gate line. Therefore, a part for reading out each of the image signals can be formed in the scanner and the sensor each including the transistor T as the switching element, by replacing, with the electric charge accumulation capacitor, the liquid crystal capacitor $C_L$ and the auxiliary capacitor $C_s$ of the picture element 37 of the liquid crystal display device shown in FIG. 12. In the structure, the source driver 32 is replaced with a circuit to which the image signal is sent from the picture element. Further, the picture elements used in the line type scanner may correspond to one line.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

A semiconductor device of the present invention has a blocking member such that a layer of ZnO or $Mg_xZn_{1-x}O$ each sensitive to an atmosphere is blocked from the atmosphere. Further, a group I element, a group III element, a group IV element, a group V element, or a group VII element is added to the ZnO or the $Mg_xZn_{1-x}O$. This allows reduction of movable electric charges generated in the active layer by providing the blocking member. The present invention makes it possible to provide a semiconductor device whose element property is stable and is never influenced by the atmosphere, and which uses the ZnO or the $Mg_xZn_{1-x}O$ by each of which the threshold voltage can be so controlled as to fall within a voltage range allowing for the practical use of the semiconductor device. Further, the semiconductor device is preferably usable for an electronic device such as a display device.

The invention claimed is:
1. A semiconductor device comprising:
   an active layer, to which nitrogen and hydrogen are added, and which is made of a semiconductor containing (i) polycrystalline ZnO or polycrystalline $Mg_xZn_{1-x}O$, (ii) amorphous ZnO or amorphous $Mg_xZn_{1-x}O$, or (iii) either (a) mixture of polycrystalline ZnO and amorphous ZnO or (b) mixture of polycrystalline $Mg_xZn_{1-x}O$ and amorphous $Mg_xZn_{1-x}O$; and
   a blocking member for blocking the active layer from an atmosphere such that the atmosphere substantially does not influence a region, in which a movable charge moves, of the active layer, wherein
   said active layer includes intentionally added dopants essentially consisting of said nitrogen and said hydrogen having concentrations so that a threshold voltage of a gate voltage of the semiconductor device, when a voltage between a drain and a source region is fixed at 10V, is controlled to be substantially is in a range between 0V and 3V.

2. A method for manufacturing the semiconductor device as set forth in claim 1, comprising the step of:
   forming the active layer under an atmosphere containing (i) one or more of nitrogen monoxide and nitrogen dioxide, and (ii) hydrogen peroxide.

3. The semiconductor device as set forth in claim 1, wherein:
   the blocking member is made up of different blocking layers.

4. The semiconductor device as set forth in claim 3, wherein:
   at least one of the blocking layers is made of $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_{2O}$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, BaCeO$_3$, SrZrO$_3$, BaZrO$_3$, LiGaO$_2$, (Li$_{1-(x+y)}$Na$_x$K$_y$)(Ga$_{1-z}$Al$_z$)O$_2$, or a solid solution containing at least two of them.

5. The semiconductor device as set forth in claim 4, wherein:
a blocking layer constituting the blocking layers is made of SiO$_2$, Al$_2$O$_3$, AlN, MgO, Ta$_2$O$_5$, TiO$_2$, ZrO$_2$, stab-ZrO$_2$, CeO$_2$, K$_2$O, Li$_2$O, Na$_2$O, Rb$_{2O}$, In$_2$O$_3$, La$_2$O$_3$, Sc$_2$O$_3$, Y$_2$O$_3$, KNbO$_3$, KTaO$_3$, BaTiO$_3$, CaSnO$_3$, CaZrO$_3$, CdSnO$_3$, SrHfO$_3$, SrSnO$_3$, SrTiO$_3$, YScO$_3$, CaHfO$_3$, MgCeO$_3$, SrCeO$_3$, BaCeO$_3$, SrZrO$_3$, BaZrO$_3$, LiGaO$_2$, (Li$_{1-(x+y)}$Na$_x$K$_y$)(Ga$_{1-z}$Al$_z$)O$_2$, or a solid solution containing at least two of them, and
said blocking layer is so provided as to meet the active layer separately from (i) each of two electrodes serving as blocking layers and connected to the active layer, and (ii) an insulating layer, which serves as a blocking layer and meets the active layer, for insulating the active layer from a control electrode for controlling move of a movable electric charge in the active layer.

6. The semiconductor device as set forth in claim 3, wherein:
at least one of the blocking layers is made of resin.

7. The semiconductor device as set forth in claim 6, wherein:
a blocking layer constituting the blocking layers is made of resin, and
said blocking layer is so provided as to meet the active layer separately from (i) each of two electrodes serving as blocking layers and connected to the active layer, and (ii) an insulating layer, which serves as a blocking layer and meets the active layer, for insulating the active layer from a control electrode for controlling move of a movable electric charge in the active layer.

8. The semiconductor device as set forth in claim 3, further comprising:
a gate electrode for controlling move of a movable electric charge in the active layer;
a gate insulating layer, which serves as a blocking layer, for insulating the active layer from the gate electrode;
a source electrode connected to the active layer; and
a drain electrode connected to the active layer,
wherein:
at least one of the blocking layers is made of SiO$_2$, Al$_2$O$_3$, AlN, MgO, Ta$_2$O$_5$, TiO$_2$, ZrO$_2$, stab-ZrO$_2$, CeO$_2$, K$_2$O, Li$_2$O, Na$_2$O, Rb$_{2O}$, In$_2$O$_3$, La$_2$O$_3$, Sc$_2$O$_3$, Y$_2$O$_3$, KNbO$_3$, KTaO$_3$, BaTiO$_3$, CaSnO$_3$, CaZrO$_3$, CdSnO$_3$, SrHfO$_3$, SrSnO$_3$, SrTiO$_3$, YScO$_3$, CaHfO$_3$, MgCeO$_3$, SrCeO$_3$, BaCeO$_3$, SrZrO$_3$, BaZrO$_3$, LiGaO$_2$, a mixed crystal of LiGaO$_2$ such as (Li$_{1-(x+y)}$Na$_x$K$_y$)(Ga$_{1-z}$Al$_z$)O$_2$, or a solid solution containing at least two of them.

9. The semiconductor device as set forth in claim 8, wherein:
a blocking layer constituting the blocking layers is made of SiO$_2$, Al$_2$O$_3$, AlN, MgO, Ta$_2$O$_5$, TiO$_2$, ZrO$_2$, stab-ZrO$_2$, CeO$_2$, K$_2$O, Li$_2$O, Na$_2$O, Rb$_{2O}$, In$_2$O$_3$, La$_2$O$_3$, Sc$_2$O$_3$, Y$_2$O$_3$, KNbO$_3$, KTaO$_3$, BaTiO$_3$, CaSnO$_3$, CaZrO$_3$, CdSnO$_3$, SrHfO$_3$, SrSnO$_3$, SrTiO$_3$, YScO$_3$, CaHfO$_3$, MgCeO$_3$, SrCeO$_3$, BaCeO$_3$, SrZrO$_3$, BaZrO$_3$, LiGaO$_2$, (Li$_{1-(x+y)}$Na$_x$K$_y$)(Ga$_{1-z}$Al$_z$)O$_2$, or a solid solution containing at least two of them, and
said blocking layer is so provided as to meet the active layer separately from the source electrode, the drain electrode, and the gate insulating layer, each of which serves as a blocking layer.

10. The semiconductor device as set forth in claim 3, further comprising:
a gate electrode for controlling move of a movable electric charge in the active layer;
a gate insulating layer, which serves as a blocking layer, for insulating the active layer from the gate electrode;
a source electrode connected to the active layer; and
a drain electrode connected to the active layer,
wherein:
at least one of the blocking layers is made of a resin.

11. The semiconductor device as set forth in claim 10, wherein:
a blocking layer constituting the blocking layers is made of a resin, and
said blocking layer is so provided as to meet the active layer separately from the source electrode, the drain electrode, and the gate insulating layer, each of which serves as a blocking layer.

12. An electronic device, comprising, as a switching element, the semiconductor device as set forth in claim 1.

13. The electronic device as set forth in claim 12, wherein:
the switching element is connected to a picture element electrode such that an image signal is written in or read out from the picture element electrode.

14. An electronic device, comprising, as a switching element, the semiconductor device as set forth in claim 3.

15. The electronic device as set forth in claim 14, wherein:
the switching element is connected to a picture element electrode such that an image signal is written in or read out from the picture element electrode.

16. An electronic device, comprising, as a switching element, the semiconductor device as set forth in claim 4.

17. The electronic device as set forth in claim 16, wherein:
the switching element is connected to a picture element electrode such that an image signal is written in or read out from the picture element electrode.

18. An electronic device, comprising, as a switching element, the semiconductor device as set forth in claim 5.

19. The electronic device as set forth in claim 18, wherein:
the switching element is connected to a picture element electrode such that an image signal is written in or read out from the picture element electrode.

20. An electronic device, comprising, as a switching element, the semiconductor device as set forth in claim 6.

21. The electronic device as set forth in claim 20, wherein:
the switching element is connected to a picture element electrode such that an image signal is written in or read out from the picture element electrode.

22. An electronic device, comprising, as a switching element, the semiconductor device as set forth in claim 7.

23. The electronic device as set forth in claim 22, wherein:
the switching element is connected to a picture element electrode such that an image signal is written in or read out from the picture element electrode.

24. An electronic device, comprising, as a switching element, the semiconductor device as set forth in claim 8.

25. The electronic device as set forth in claim 24, wherein:
the switching element is connected to a picture element electrode such that an image signal is written in or read out from the picture element electrode.

26. An electronic device, comprising, as a switching element, the semiconductor device as set forth in claim 9.

27. The electronic device as set forth in claim 26, wherein:
the switching element is connected to a picture element electrode such that an image signal is written in or read out from the picture element electrode.

28. An electronic device, comprising, as a switching element, the semiconductor device as set forth in claim 10.

29. The electronic device as set forth in claim 28, wherein: the switching element is connected to a picture element electrode such that an image signal is written in or read out from the picture element electrode.

30. An electronic device, comprising, as a switching element, the semiconductor device as set forth in claim 11.

31. The electronic device as set forth in claim 30, wherein:

the switching element is connected to a picture element electrode such that an image signal is written in or read out from the picture element electrode.

* * * * *